(12) United States Patent
Chen et al.

(10) Patent No.: US 12,112,965 B2
(45) Date of Patent: *Oct. 8, 2024

(54) WAFER SUPPORTING MECHANISM AND METHOD FOR WAFER DICING

(71) Applicant: Advanced Semiconductor Engineering, Inc., Kaohsiung (TW)

(72) Inventors: Bo Hua Chen, Kaohsiung (TW); Yan Ting Shen, Kaohsiung (TW); Fu Tang Chu, Kaohsiung (TW); Wen-Pin Huang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/112,466

(22) Filed: Feb. 21, 2023

(65) Prior Publication Data

US 2023/0197487 A1 Jun. 22, 2023

Related U.S. Application Data

(63) Continuation of application No. 17/060,003, filed on Sep. 30, 2020, now Pat. No. 11,587,809.

(51) Int. Cl.
*H01L 21/673* (2006.01)
*H01L 21/78* (2006.01)
*H01L 23/00* (2006.01)

(52) U.S. Cl.
CPC ........ *H01L 21/67346* (2013.01); *H01L 21/78* (2013.01); *H01L 23/562* (2013.01)

(58) Field of Classification Search
CPC .. H01L 21/67346; H01L 21/78; H01L 23/562
USPC ......................................................... 438/460
See application file for complete search history.

(56) References Cited

U.S. PATENT DOCUMENTS

| | | | |
|---|---|---|---|
| 6,079,356 A * | 6/2000 | Umotoy | ............ H01J 37/32449 118/728 |
| 6,201,306 B1 | 3/2001 | Kurosawa et al. | |
| 6,376,278 B1 * | 4/2002 | Egawa | ................ H01L 21/6836 438/464 |
| 6,461,942 B2 | 10/2002 | Watanabe et al. | |
| 6,496,350 B2 * | 12/2002 | Fujiwara | ................ H02N 13/00 361/128 |
| 6,677,167 B2 * | 1/2004 | Kanno | ............. H01L 21/67109 355/72 |

(Continued)

OTHER PUBLICATIONS

Final Office Action for U.S. Appl. No. 17/060,003, issued Aug. 19, 2022, 10 pages.

(Continued)

*Primary Examiner* — Vu A Vu
(74) *Attorney, Agent, or Firm* — FOLEY & LARDNER LLP

(57) ABSTRACT

A wafer supporting mechanism and a method for wafer dicing are provided. The wafer supporting mechanism includes a base portion and a support portion. The base portion includes a first gas channel and a first outlet connected to the first gas channel. The support portion is connected to the base portion and including a second gas channel connected to the first gas channel. An accommodation space is defined by the base portion and the support portion.

17 Claims, 18 Drawing Sheets

(56) References Cited

U.S. PATENT DOCUMENTS

| | | | | |
|---|---|---|---|---|
| 7,149,070 | B2* | 12/2006 | Breitschwerdt ... | H01L 21/68785 |
| | | | | 361/233 |
| 7,607,647 | B2* | 10/2009 | Zhao ................... | H01L 21/6838 |
| | | | | 269/21 |
| 7,642,205 | B2* | 1/2010 | Timans ............. | H01L 21/67115 |
| | | | | 438/795 |
| 7,815,740 | B2* | 10/2010 | Oohashi ............ | H01J 37/32724 |
| | | | | 118/724 |
| 8,419,888 | B2* | 4/2013 | Hamazaki ............... | H01L 24/83 |
| | | | | 438/118 |
| 8,951,037 | B2* | 2/2015 | Jang ......................... | B29C 45/34 |
| | | | | 425/573 |
| 10,115,646 | B2* | 10/2018 | Hoegerl .................. | H01L 24/92 |
| 10,351,956 | B2 | 7/2019 | Yudovsky et al. | |
| 11,587,809 | B2* | 2/2023 | Chen ................. | H01L 21/67092 |
| 2012/0187598 | A1* | 7/2012 | Lee ......................... | B29C 43/18 |
| | | | | 425/73 |
| 2015/0206852 | A1* | 7/2015 | Lin ..................... | H01L 25/0655 |
| | | | | 174/255 |
| 2018/0337141 | A1* | 11/2018 | Priewasser .......... | H01L 21/6836 |

OTHER PUBLICATIONS

Non-Final Office Action for U.S. Appl. No. 17/060,003, issued Apr. 15, 2022, 17 pages.

Notice of Allowance for U.S. Appl. No. 17/060,003, issued Oct. 19, 2022, 8 pages.

* cited by examiner

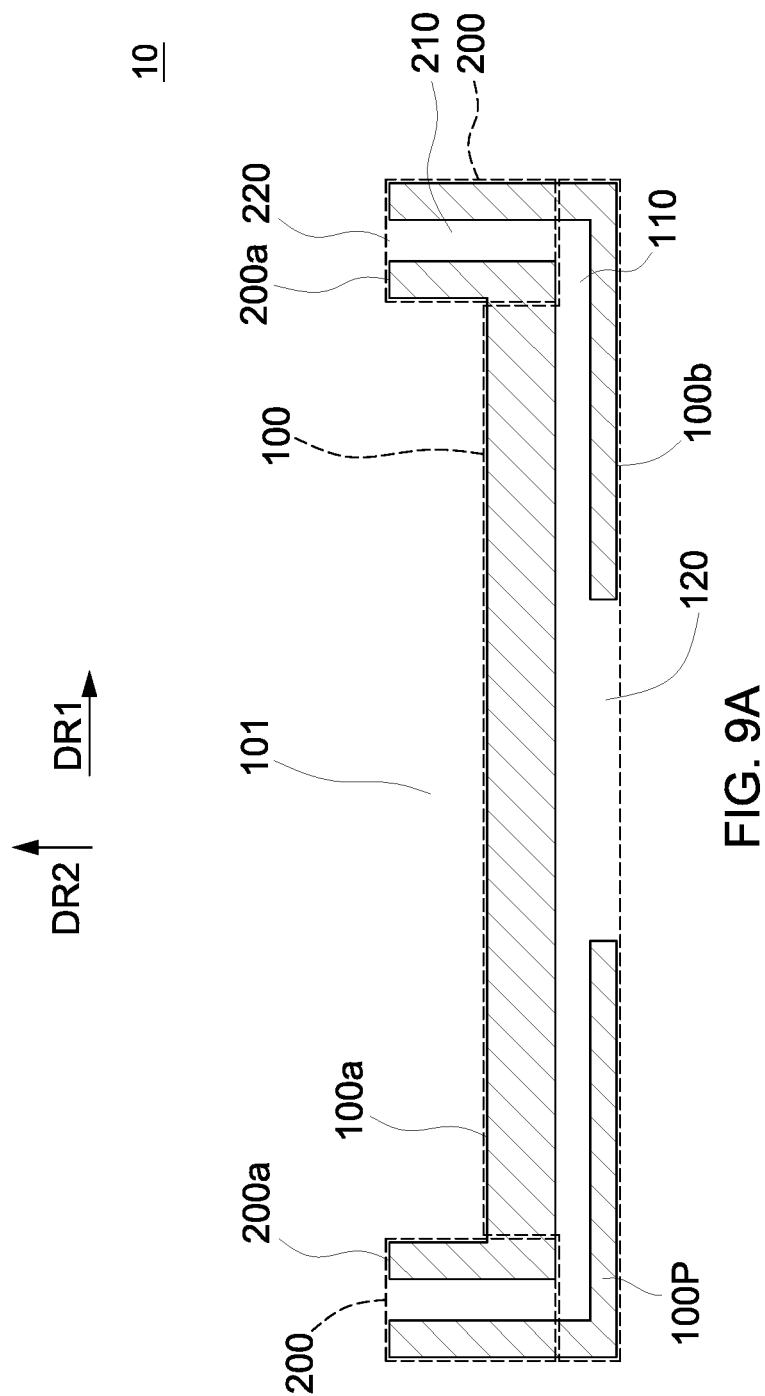

//wafer to the wafer supporting mechanism by exhausting gas from the gas channel through the first outlet; and dicing the wafer.

WAFER SUPPORTING MECHANISM AND METHOD FOR WAFER DICING

CROSS-REFERENCE TO RELATED APPLICATION

This application is a continuation of U.S. patent application Ser. No. 17/060,003 filed Sep. 30, 2020, now issued as U.S. Pat. No. 11,587,809, the contents of which is incorporated herein by reference in its entirety.

BACKGROUND

1. Technical Field

The present disclosure relates generally to a wafer supporting mechanism and a method for wafer dicing.

2. Description of the Related Art

In the process of manufacturing a semiconductor package, semiconductor layers are formed on a wafer, and then the wafer is cut or diced into individual semiconductor devices or dies for further packaging. The wafer may be diced by various techniques, for example, laser stealth dicing. One approach of the laser stealth dicing is performed on the back side of the wafer so as to prevent the laser transmission or focusing problems caused by the metal layers or metal layouts on the front side of the wafer, where the semiconductor layers and metal layouts reside. However, in some wafer dicing operations, the wafer is disposed on a chuck table with the back side of the wafer facing up, current configuration may cause the wafer to be deformed or warped by gravity force and/or vacuum suction, rendering a surface warpage great enough to disable the process of laser focusing alignment. Current wafer dicing practice requires a solution to ameliorate wafer warpage during dicing, in order to provide better dicing yield.

SUMMARY

In one or more embodiments, a wafer supporting mechanism includes a base portion and a support portion. The base portion includes a first gas channel and a first outlet connected to the first gas channel. The support portion is connected to the base portion and includes a second gas channel connected to the first gas channel. An accommodation space is defined by the base portion and the support portion.

In one or more embodiments, a wafer supporting mechanism includes a cavity table. The cavity table includes a base plate, a first support wall, and a first gas channel. The first support wall is connected to the base plate. The first gas channel is in the first support wall, and the first gas channel is configured to align to a peripheral region of a wafer. An accommodation space is defined by the base plate and an inner sidewall of the support wall.

In one or more embodiments, a method for wafer dicing includes the following operations: providing a wafer supporting mechanism including a gas channel and a first outlet connected to the gas channel, the gas channel having at least a second outlet; providing a wafer including a plurality of semiconductor devices on a first surface of the wafer; disposing the wafer on the wafer supporting mechanism to cover the open terminal of the gas channel; fixating the wafer to the wafer supporting mechanism by exhausting gas from the gas channel through the first outlet; and dicing the wafer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 9A, FIG. 9B, FIG. 9C, FIG. 9D, and FIG. 9E illustrate various operations in a method of dicing a wafer in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
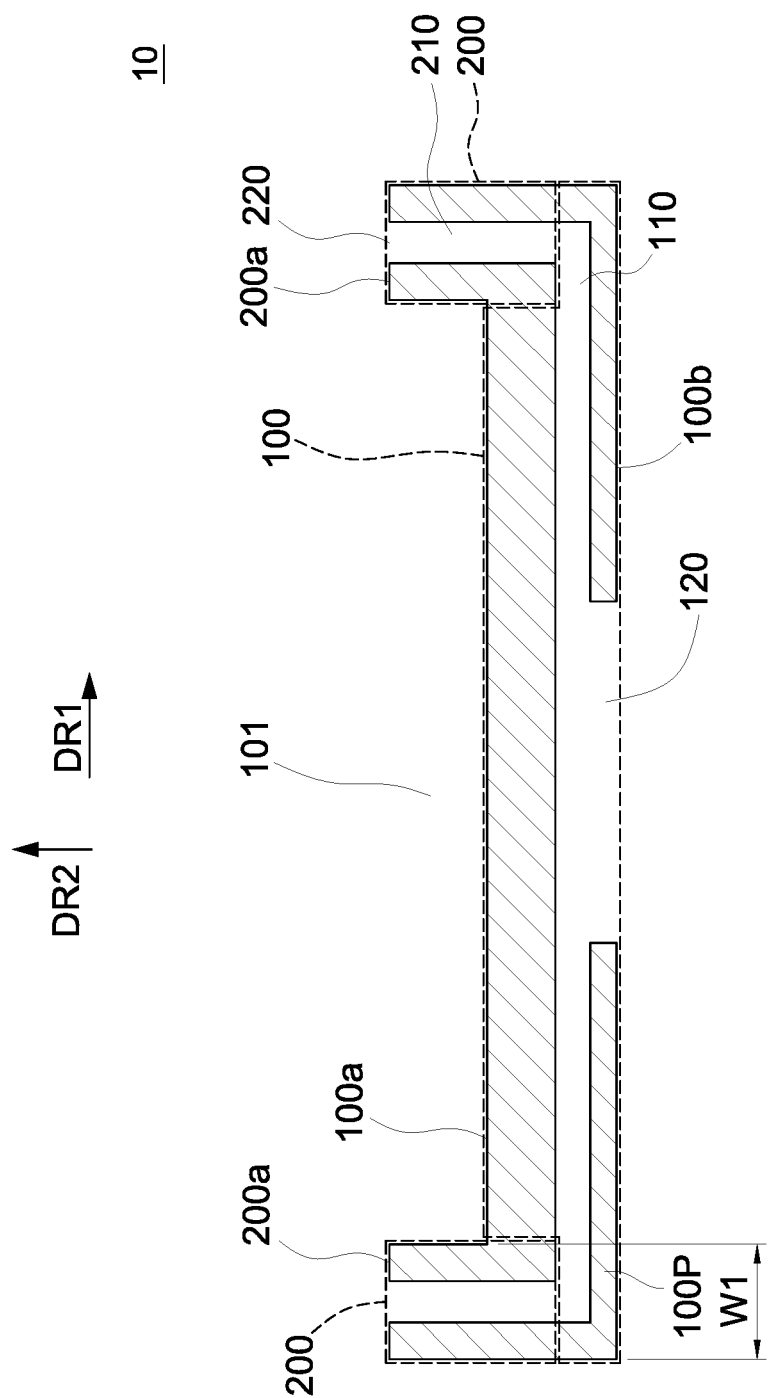
FIG. 1A illustrates a cross-sectional view of a wafer supporting mechanism in accordance with some embodiments of the present disclosure.

FIG. 1A illustrates a cross-sectional view of a wafer supporting mechanism 10 in accordance with some embodiments of the present disclosure. The wafer supporting mechanism 10 includes a base portion 100 and a support portion 200. In some embodiments, the wafer supporting mechanism 10 may serve to support a wafer in a wafer dicing process.

The base portion 100 includes a gas channel 110 and an outlet 120 connected to the gas channel 110. In some embodiments, the gas channel 110 is embedded in the base portion 100. In some embodiments, the gas channel 110 extends along a direction substantially parallel to an extending direction DR1 of the surface 100b of the base portion 100. In some embodiments, the outlet 120 is exposed from a surface 100b (also referred to as "a bottom surface") of the base portion 100. In some embodiments, the outlet 120 is configured to connect to an exhaust mechanism (not shown in FIG. 1A) for exhausting gas from the gas channel 110.

The support portion 200 is connected to the base portion 100. In some embodiments, the support portion 200 is connected to a peripheral region 100P of the base portion 100. In some embodiments, the base portion 100 and the support portion 200 may be integrally formed or one-piece formed. In some embodiments, the base portion 100 in combination with the support portion 200 is monolithic.

In some embodiments, the support portion 200 includes a gas channel 210 and an outlet 220 connected to the gas channel 210. In some embodiments, the gas channel 210 is embedded in the support portion 200. In some embodiments, the gas channel 210 of the support portion 200 is connected to the gas channel 110 of the base portion 100. In some embodiments, the gas channel 210 extends along a direction DR2 substantially perpendicular to the extending direction (e.g., the direction DR1) of the gas channel 110 of the base portion 100. In some embodiments, the outlet 220 is facing away from the base portion 100. In some embodiments, the outlet 220 is exposed from a surface 200a (also referred to as "an upper surface") of the support portion 200. In some embodiments, the outlet 220 is configured to contact to a peripheral region of a wafer (not shown in FIG. 1A).

In some embodiments, the support portion 200 has a width W1 along the extending direction (e.g., the direction DR1) of the gas channel 110 of the base portion 100, and the width W1 is equal to or less than 20 μm. In some embodiments, the width W1 of the support portion 200 is equal to or less than 15 μm. In some embodiments, the width W1 of the support portion 200 is equal to or less than 10 μm. According to some embodiments of the present disclosure, with the design of the relatively small width W1 of the support portion 200, a wafer without a peripheral dummy region or with a small peripheral dummy region can still be supported by the support portion 200 of the wafer supporting mechanism 10 without any unnecessary waste of the wafer area occupied by the support portion 200, and thus the wafer area usage can be increased.

In some embodiments, an accommodation space 101 is defined by the base portion 100 and the support portion 200. In some embodiments, a bottom of the accommodation space 101 is defined by the surface 100a (also referred to as "an upper surface") of the base portion 100. In some embodiments, the accommodation space 101 is isolated from the gas channels 110 and 210.

According to some embodiments of the present disclosure, with the design of the gas channels 110 and 210, a region of a wafer can be supported by and fixated to the support portion 200 of the wafer supporting mechanism 10 through vacuum suction provided through the gas channels 110 and 210 when performing a wafer dicing operation. Therefore, aligning accuracy of the wafer dicing operation can be improved by the fixation provided by the vacuum suction, and the diced wafer can be easily removed from the wafer supporting mechanism 10 by removing vacuum suction without damaging the diced wafer, such that the process of the wafer dicing operation is simplified, and the yield of the wafer dicing operation can be increased.

Moreover, according to some embodiments of the present disclosure, with the design of the accommodation space 101 together with the gas channels 110 and 210, semiconductor device(s) of the wafer can be received within the accommodation space 101 when performing a wafer dicing operation, and a peripheral region of the wafer that surrounds the semiconductor device(s) can be well supported by the support portion 200 of the wafer supporting mechanism 10. Therefore, the semiconductor device(s) of the wafer that have surface(s) elevated from a surface of the wafer can be disposed facing the wafer supporting mechanism 10 during the wafer dicing operation while the peripheral region of the wafer remains well supported by the support portion 200, and thus occurrence of warpage of the peripheral region of the wafer during the wafer dicing process can be effectively prevented, and the yield of the wafer dicing operation can be increased.

Figure 1B:
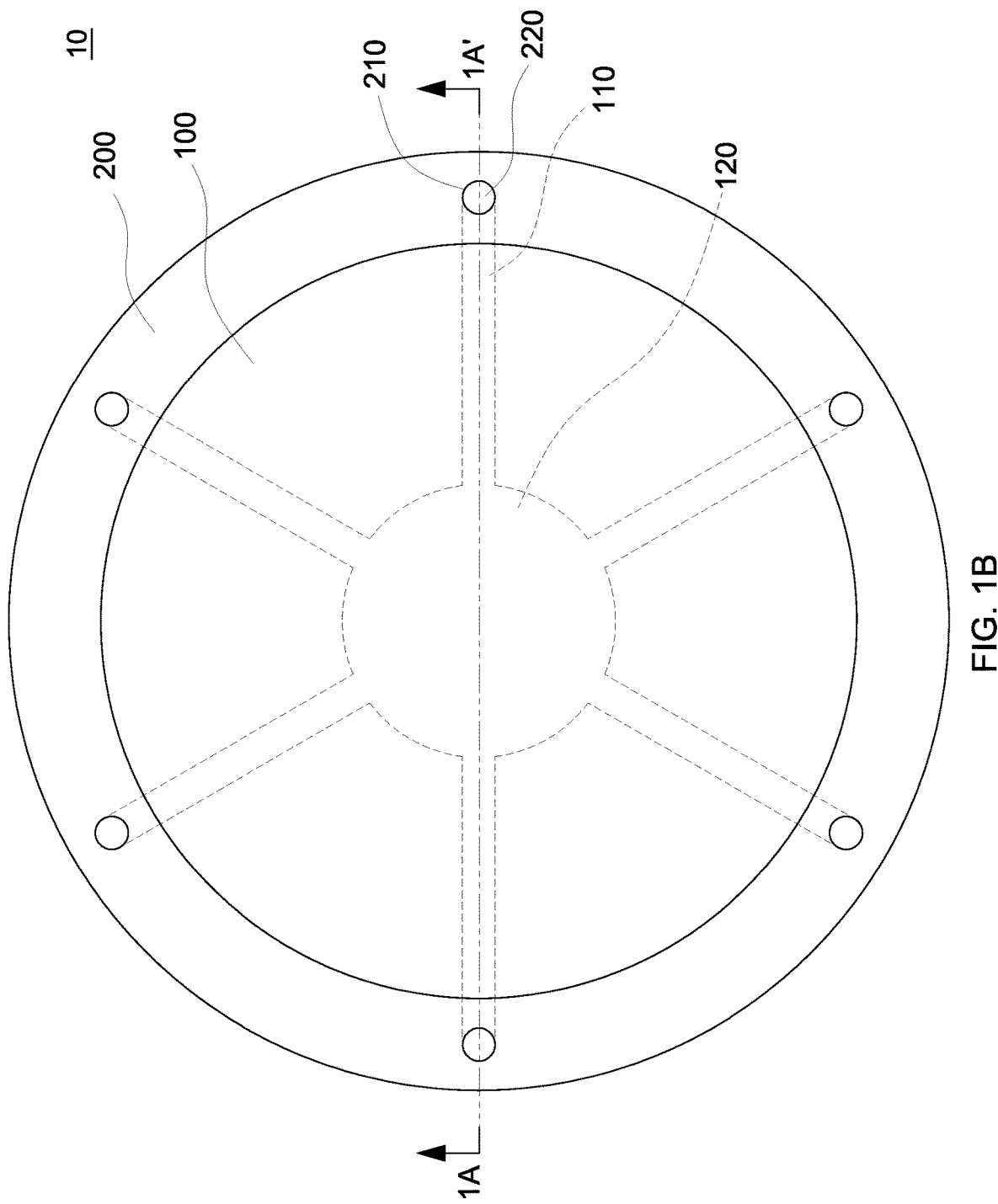
FIG. 1B illustrates a top view of a wafer supporting mechanism in accordance with some embodiments of the present disclosure.

FIG. 1B illustrates a top view of a wafer supporting mechanism 10 in accordance with some embodiments of the present disclosure. In some embodiments, FIG. 1A illustrates a cross-sectional view along the cross-sectional line 1A-1A' in FIG. 1B.

In some embodiments, the base portion 100 includes a circular shape. In some embodiments, the base portion 100 includes a circular shape from a top view perspective. In some embodiments, the support portion 200 includes a ring shape. In some embodiments, the support portion 200 includes a ring shape from a top view perspective.

In some embodiments, the wafer supporting mechanism 10 further includes a plurality of the gas channels 110 connected to the outlet 120. In some embodiments, the wafer supporting mechanism 10 further includes a plurality of the gas channels 210 each connecting to each of the gas channels 110. In some embodiments, the wafer supporting mechanism 10 further includes a plurality of the outlets 220 each connecting to each of the gas channels 210. According to some embodiments, the outlets 220 dispersedly arranged over the support portion 200 can provide a relatively strong fixation to the wafer during the wafer dicing operation.

In some embodiments, the wafer supporting mechanism 10 may include an outlet 220 which includes a ring shape (e.g., similar to the ring shape of the outlet 220 shown in FIG. 8B, which will be discussed hereinafter) that is connected to the plurality of the gas channels 210. In some embodiments, the ring-shaped outlet 220 may be configured to contact a peripheral region of a wafer. According to some embodiments of the present disclosure, with the aforesaid design of the ring-shaped outlet 220 together with the gas channels 210, a wafer can be fixated to the support portion 200 through vacuum suction through the outlet 220 and the gas channels 210 more strongly and stably during the wafer dicing operation.

Figure 1C:
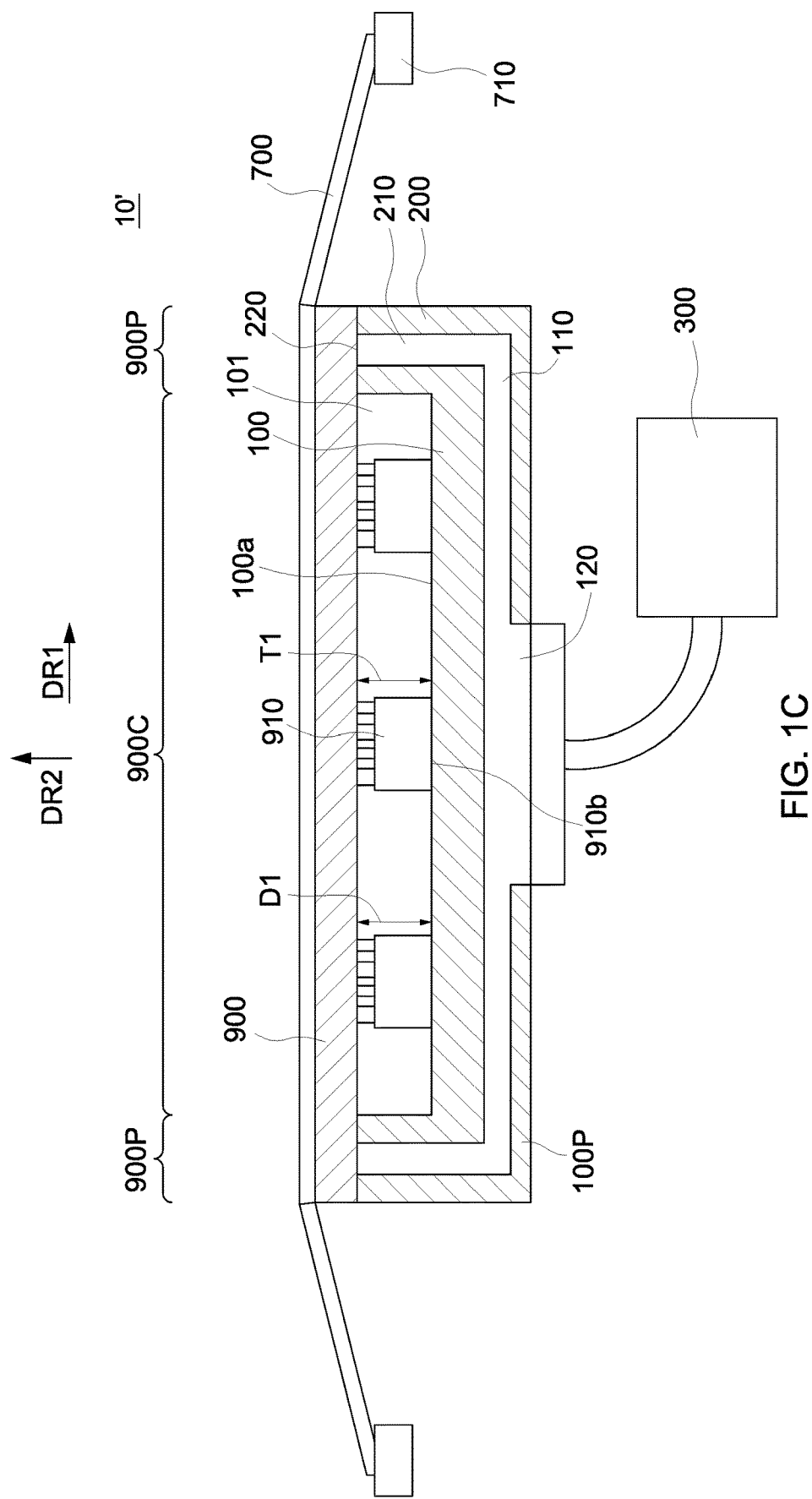
FIG. 1C illustrates a cross-sectional view of a wafer supporting mechanism in accordance with some embodiments of the present disclosure.

FIG. 1C illustrates a cross-sectional view of a wafer supporting mechanism 10' in accordance with some embodiments of the present disclosure. The wafer supporting mechanism 10' is similar to the wafer supporting mechanism 10 in FIG. 1 except that, for example, the wafer supporting mechanism 10' further includes an exhaust mechanism 300.

The support portion 200 of the wafer supporting mechanism 10' is configured to provide support to a wafer 900. In some embodiments, the support portion 200 is configured to contact a peripheral region 900P of the wafer 900. In some embodiments, the outlet 220 of the support portion 200 is configured to contact the peripheral region 900P of the wafer 900. In some embodiments, a center region 900C surrounded by the peripheral region 900P of the wafer 900 is exposed to the accommodation space 101. In some embodiments, the wafer 900 is adhered to a flexible tape 700 that is fixated on a frame 710.

The exhaust mechanism 300 is connected to the outlet 120 of the base portion 100. In some embodiments, the exhaust mechanism 300 is configured to exhaust gas from the gas channel 110 of the base portion 100 and the gas channel 210 of the support portion 200. In some embodiments, the exhaust mechanism 300 is configured to provide vacuum suction to the wafer 900 through the outlet 220 that is connected to the gas channel 210 of the support portion 200. According to some embodiments of the present disclosure, the wafer 900 can be fixated to the support portion 200 of the wafer supporting mechanism 10' through vacuum suction when performing a wafer dicing operation, and thus the aligning accuracy of the wafer dicing operation can be improved; in addition, the diced wafer can be easily removed from the wafer supporting mechanism 10' by removing vacuum suction without damaging the diced wafer, such that the process of the wafer dicing operation is simplified, and the yield of the wafer dicing operation can be increased.

In some embodiments, the accommodation space 101 is isolated from the gas channels 110 and 210. In some embodiments, a pressure within the gas channels 110 and 210 is lower than a pressure within the accommodation space 101 when the exhaust mechanism 300 is providing vacuum suction to the wafer 900 through the outlet 220 of the support portion 200. In some embodiments, a pressure within the accommodation space 101 is constantly remained at about 1 atm or higher. According to some embodiments of the present disclosure, the center region 900C of the wafer 900 is exposed to the accommodation space 101 with the aforesaid pressure condition rather than a relatively low pressure condition (e.g., under a vacuum suction condition), such that the center region 900C of the wafer 900 is less likely to be pulled by a low-pressure force while the peripheral region 900P of the wafer 900 is fixated to the wafer supporting mechanism 10', and thus occurrence of warpage of the wafer 900 during the wafer dicing process can be effectively prevented.

In some embodiments, the accommodation space 101 is configured to accommodate one or more semiconductor devices 910 on a surface 901 of the wafer 900. In some embodiments, the one or more semiconductor devices 910 are located at the center region 900C of the wafer 900. In some embodiments, a depth D1 of the accommodation space 101 is substantially equal to or greater than a thickness T1 of the semiconductor device 910. In some embodiments, a bottom (e.g., the surface 100a of the base portion 100) of the accommodation space 101 is in contact with a non-active surface 910b of the semiconductor device 910. Accordingly, the wafer 900, for example, particularly the center region 900C of the wafer 900, can be further supported by the semiconductor devices 910 that abut the bottom of the accommodation space 100, and therefore occurrence of warpage of the wafer 900 during the wafer dicing process can be more effectively prevented. For example, the warpage of the wafer 900 in accordance with some embodiments of the present disclosure may be equal to or less than 20 μm. In other words, for example, the surface deviation of the wafer 900 in accordance with some embodiments of the present disclosure may be within ±20 μm.

The wafer supporting mechanism 10' of FIG. 1C provides mechanical supports and fixating means (e.g., vacuum suction) at the edge of the wafer (e.g., the peripheral region 900P), while the device region of the wafer (e.g., the center region 900C) is aligned with the accommodation space 101 to form a secondary mechanical support depending on the thickness T1 of the semiconductor device 910 and the depth D1 of the accommodation space 101. In some embodiments, the chip on wafer (COW) structure can be well supported and fixated by the wafer supporting mechanism 10' illustrated in FIG. 1C during wafer dicing while maintaining an acceptable surface deviation (e.g., small surface warpage) that enables a stealth dicing machine to continuing register the focusing depth in the wafer.

Figure 2:
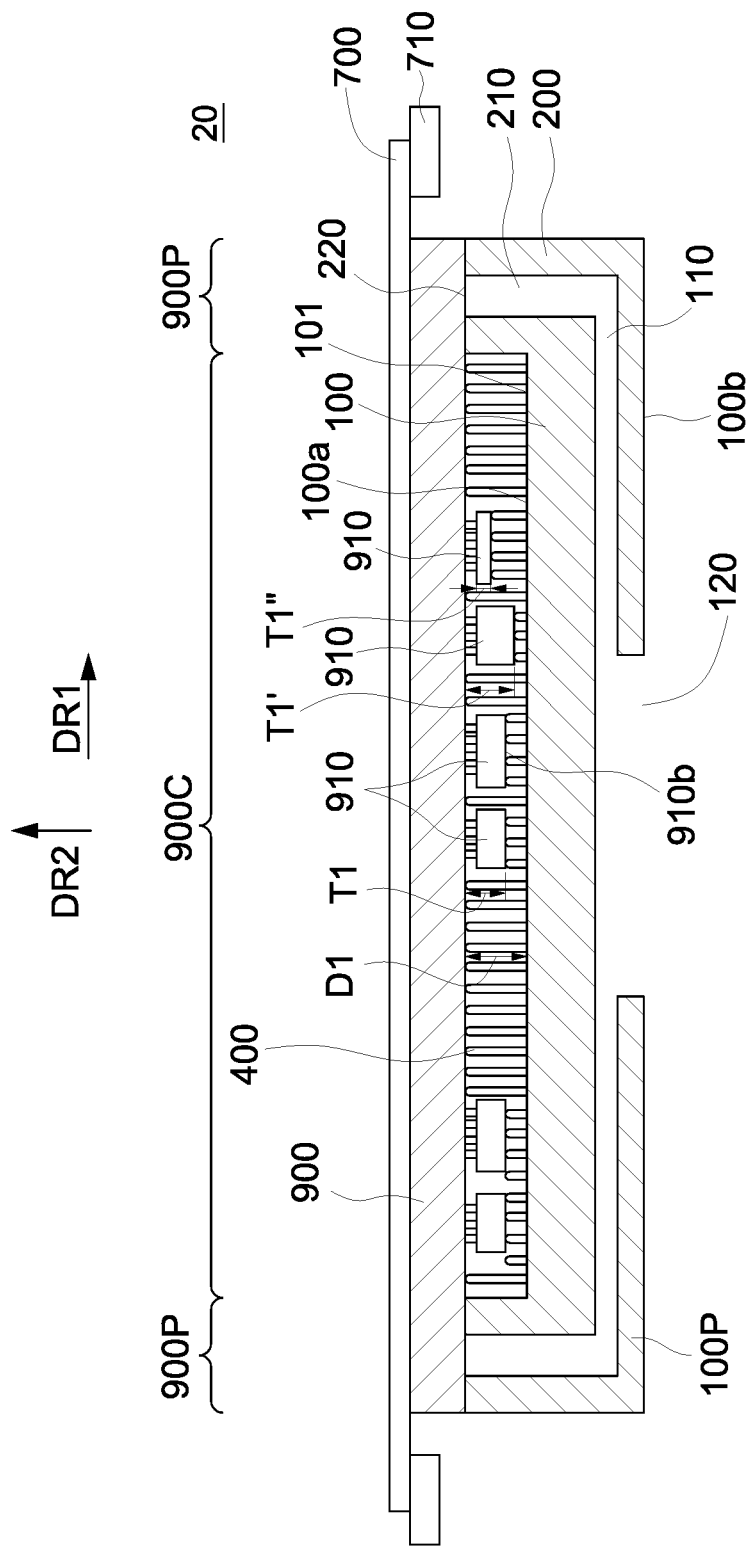
FIG. 2 illustrates a cross-sectional view of a wafer supporting mechanism in accordance with some embodiments of the present disclosure.

FIG. 2 illustrates a cross-sectional view of a wafer supporting mechanism in accordance with some embodiments of the present disclosure. The wafer supporting mechanism 20 is similar to the wafer supporting mechanism 10 in FIG. 1 except that, for example, the wafer supporting mechanism 20 further includes a plurality of support pins 400.

In some embodiments, the support pins 400 are in the accommodation space 101 and movably engaged with the base portion 100. In some embodiments, the support pins 400 are movable along a direction DR2 substantially perpendicular to an extending direction DR1 of the surface 100b of the base portion 100. In some embodiments, the support pins 400 may move along the direction DR2 to retract within the base portion 100 or extend into the accommodation space 101 to contact the semiconductor devices 910. In some embodiments, the support pins 400 are movably engaged with the base portion 100 and configured to contact the non-active surfaces 910b of the semiconductor devices 910 in the accommodation space 101.

According to some embodiments of the present disclosure, with the design of the support pins 400, the center region 900C of the wafer 900 arranged with the semiconductor devices 910 having various thicknesses (e.g., thicknesses T1, T1' and T1") received in the accommodation space 101 can be nicely supported by the support pins 400, and thus occurrence of warpage of the wafer 900 during the wafer dicing process can be more effectively prevented.

Figure 3:
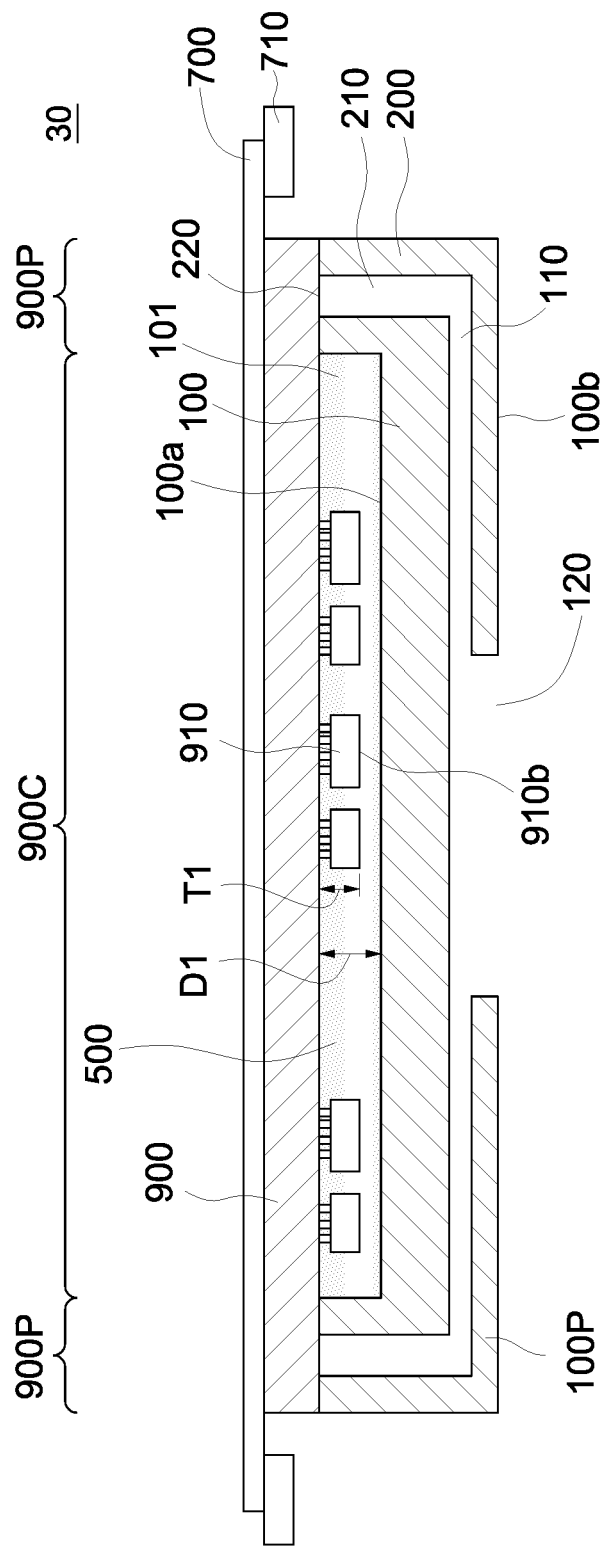
FIG. 3 illustrates a cross-sectional view of a wafer supporting mechanism in accordance with some embodiments of the present disclosure.

FIG. 3 illustrates a cross-sectional view of a wafer supporting mechanism 30 in accordance with some embodiments of the present disclosure. The wafer supporting mechanism 30 is similar to the wafer supporting mechanism 10 in FIG. 1 except that, for example, the wafer supporting mechanism 30 further includes a deformable cushion 500.

In some embodiments, the deformable cushion 500 is disposed in the accommodation space 101. In some embodiments, the deformable cushion 500 is filled in the accommodation space 101. In some embodiments, the deformable cushion 500 is configured to contact the semiconductor devices 910 of the wafer 900. In some embodiments, the deformable cushion 500 may be made of or include a film-on-wire (FOW) layer.

According to some embodiments of the present disclosure, with the arrangement of the deformable cushion 500, the semiconductor devices 910 of the wafer 900 received in the accommodation space 101 can be nicely surrounded and supported by the deformable cushion 500, and thus occurrence of warpage of the wafer 900 during the wafer dicing process can be more effectively prevented.

Figure 4A:
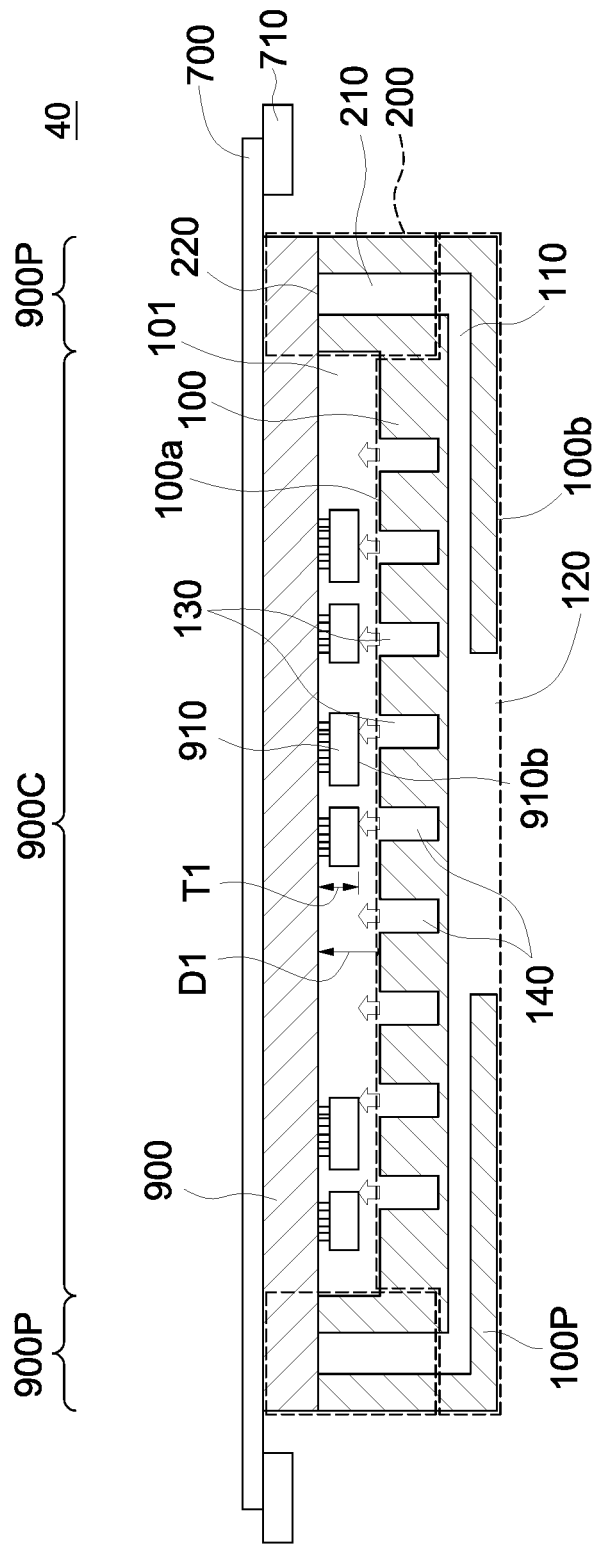
FIG. 4A illustrates a cross-sectional view of a wafer supporting mechanism in accordance with some embodiments of the present disclosure.

FIG. 4A illustrates a cross-sectional view of a wafer supporting mechanism 40 in accordance with some embodiments of the present disclosure. The wafer supporting mechanism 40 is similar to the wafer supporting mechanism 10 in FIG. 1 except that, for example, the wafer supporting mechanism 40 further includes a plurality of gas outlets 130.

In some embodiments, the gas outlets 130 are configured to purge gas into the accommodation space 101. In some embodiments, the gas outlets 130 are configured to purge gas towards the semiconductor devices 910 of the wafer 900.

In some embodiments, the base portion 100 further includes a plurality of gas channels 140 each connecting to each of the gas outlets 130. In some embodiments, the gas channels 140 are isolated from the gas channel 110 and gas channel 210. In some embodiments, the gas channels 140 are connected to a gas supply (now shown in FIG. 4A) independent to an exhaust mechanism (shown in FIG. 1C) connected to the outlet 120. In some embodiments, gas provided by the gas supply and flowing through the gas channels 140 is purged into the accommodation space 101 through the gas outlets 130 for the purpose of providing additional mechanical support to the center region 900C of the wafer 900. In some embodiments, the gases purged from different gas outlets 130 through different corresponding gas channels 140 may be different from each other, and the strengths of forces applied from the gases purged from different gas outlets 130 through different corresponding gas channels 140 may be adjusted to different predetermined values to more precisely meet the semiconductor device arrangement on the front side of the wafer 900.

Figure 4B:
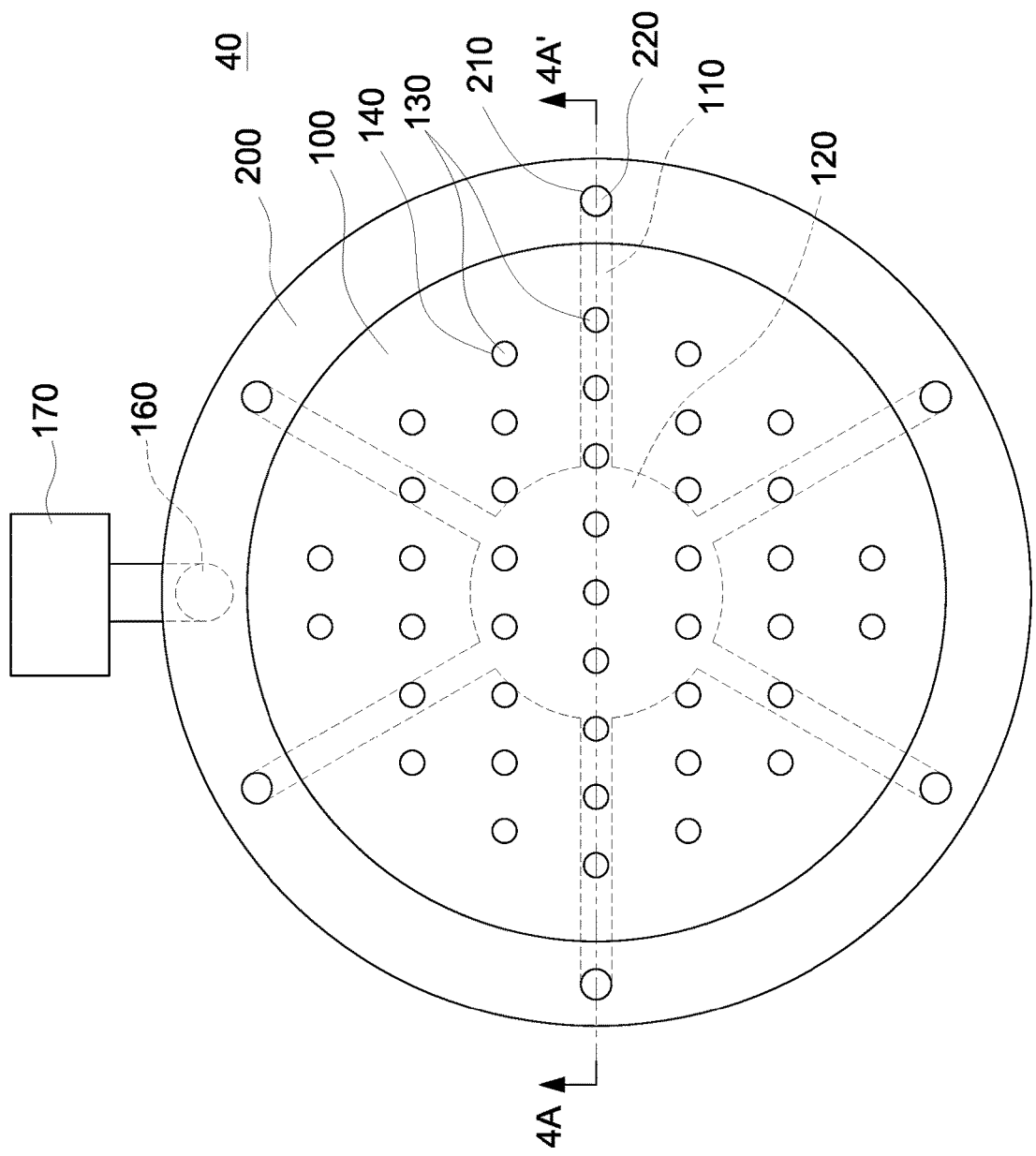
FIG. 4B illustrates a top view of a wafer supporting mechanism in accordance with some embodiments of the present disclosure.

FIG. 4B illustrates a top view of a wafer supporting mechanism 40 in accordance with some embodiments of the present disclosure. In some embodiments, FIG. 4A illustrates a cross-sectional view along the cross-sectional line 4A-4A' in FIG. 4B.

In some embodiments, the gas outlets 130 are dispersedly arranged over the base portion 100. In some embodiments, the gas channels 140 are connected to a gas outlet 160 through additional gas channels (not shown in FIG. 4B) embedded in the base portion 100, and the gas outlet 160 is connected to a gas supply 170 from outside the base portion 100 and the support portion 200. In some embodiments, the gas outlet 160 may be located under the support portion 200 and exposed from the surface 100b of the base portion 100.

According to some embodiments of the present disclosure, with the design of the gas outlets 130, the semiconductor devices 910 of the wafer 900 received in the accommodation space 101 can be supported uniformly by the force from the purged gas, and thus occurrence of warpage of the wafer 900 during the wafer dicing process can be more effectively prevented.

Figure 5:
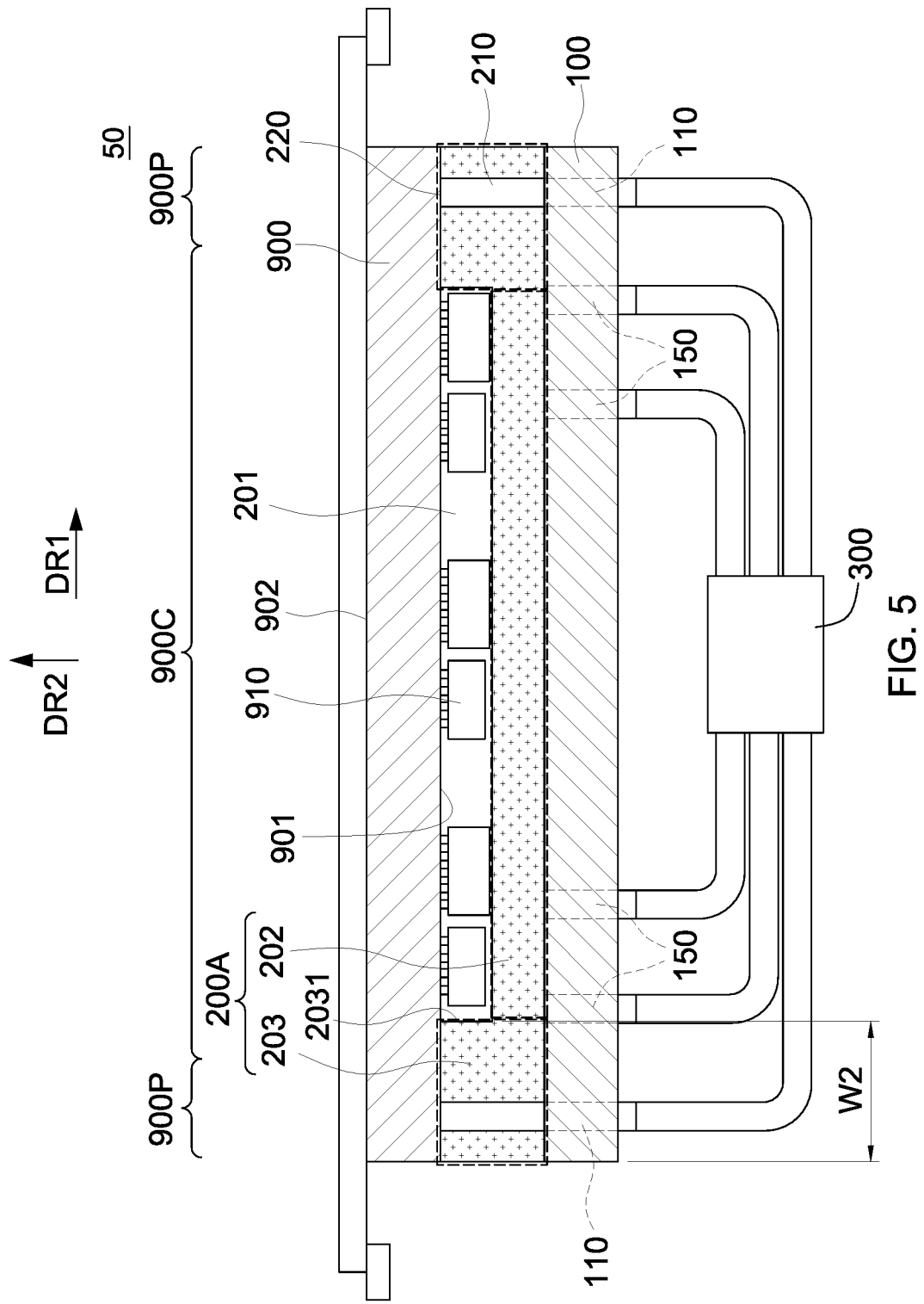
FIG. 5 illustrates a cross-sectional view of a wafer supporting mechanism in accordance with some embodiments of the present disclosure.

FIG. 5 illustrates a cross-sectional view of a wafer supporting mechanism 50 in accordance with some embodiments of the present disclosure. The wafer supporting mechanism 50 includes a base portion 100 and a cavity table 200A. In some embodiments, the wafer supporting mechanism 50 may serve to support a wafer in a wafer dicing process.

In some embodiments, the cavity table 200A includes a base plate 202, a support wall 203, and a gas channel 210.

In some embodiments, the support wall 203 is connected to the base plate 202. In some embodiments, an accommodation space 201 is defined by the base plate 202 and an inner sidewall 2031 of the support wall 203. In some embodiments, the gas channel 210 is in the support wall 203 and configured to align to a peripheral region 900P of a wafer 900. In some embodiments, the accommodation space 201 is configured to accommodate one or more semiconductor devices 910 on a surface 901 of the wafer 900. In some embodiments, the wafer 900 has a surface 902 opposite to the surface 901, and the surface 902 of the wafer 900 is adhered to a flexible tape 700 when performing a wafer dicing operation.

In some embodiments, the support wall 203 has a width W2 along the extending direction (e.g., the direction DR1) of the surface 100a of the base portion 100, and the width W2 is equal to or less than 20 µm. In some embodiments, the width W2 of the support wall 203 is equal to or less than 15 µm. In some embodiments, the width W2 of the support wall 203 is equal to or less than 10 µm. According to some embodiments of the present disclosure, with the design of the relatively small width W2 of the support wall 203, even the wafer 900 does not have a dummy section or only has a small dummy section at the peripheral region 900P, the wafer 900 can still be supported by the support wall 203 of the wafer supporting mechanism 50 for wafer dicing operation without any unnecessary waste of the wafer area occupied by the support wall 203, and thus the wafer area usage can be increased.

In some embodiments, the base portion 100 supports the cavity table 200A and is configured to provide vacuum suction to the cavity table 200A. In some embodiments, the cavity table 200A is fixated to the base portion 100 through vacuum suction provided from the base portion 100. According to some embodiments of the present disclosure, with the design of fixation by vacuum suction between the cavity table 200A and the base portion 100, the cavity table 200A can be disposed and fixated at a predetermined position during a great number of wafer dicing operations without manually adjusting the position of the cavity table 200A, and thus the wafers to be diced can be delivered onto the cavity table 200A automatically, such that the process of the wafer dicing operation is simplified. In addition, since the cavity tables 200A can be nicely fixated to the base portion 100 and can also easily removed from the base portion 100, various types of cavity tables 200A can be designed according to different wafer structures and switched between different wafer dicing operations, and thus the applications of the wafer support mechanism 50 are wider.

In some embodiments, the base portion 100 includes a gas channel 110 at least partially connected to the gas channel 210 in the support wall 203. In some embodiments, the base portion 100 may include a plurality of the gas channels 110 at least partially connected to one or more gas channels 210 in the support wall 203. Accordingly, the peripheral region 900P of the wafer 900 can be supported by and fixated to the support wall 203 through vacuum suction through the gas channels 110 and 210.

In some embodiments, the base portion 100 further includes a gas channel 150 contacting the base plate 202 of the cavity table 200A. In some embodiments, the base portion 100 may include a plurality of the gas channels 150 contacting the base plate 202 of the cavity table 200A. Accordingly, base plate 202 can be fixated to the base portion 100 through vacuum suction through the gas channel(s) 150.

In some embodiments, the wafer support mechanism 50 further includes an exhaust mechanism 300 connected to the base portion 100. In some embodiments, the exhaust mechanism 300 is configured to provide vacuum suction to the wafer 900 through the gas channel 210. In some embodiments, the exhaust mechanism 300 is connected to the one or more gas channels 110. In some embodiments, the exhaust mechanism 300 is connected to the one or more gas channels 150. In some other embodiments, the gas channels 110 and the gas channels 150 may be connected to different exhaust mechanisms (not shown in FIG. 5).

Figure 6:
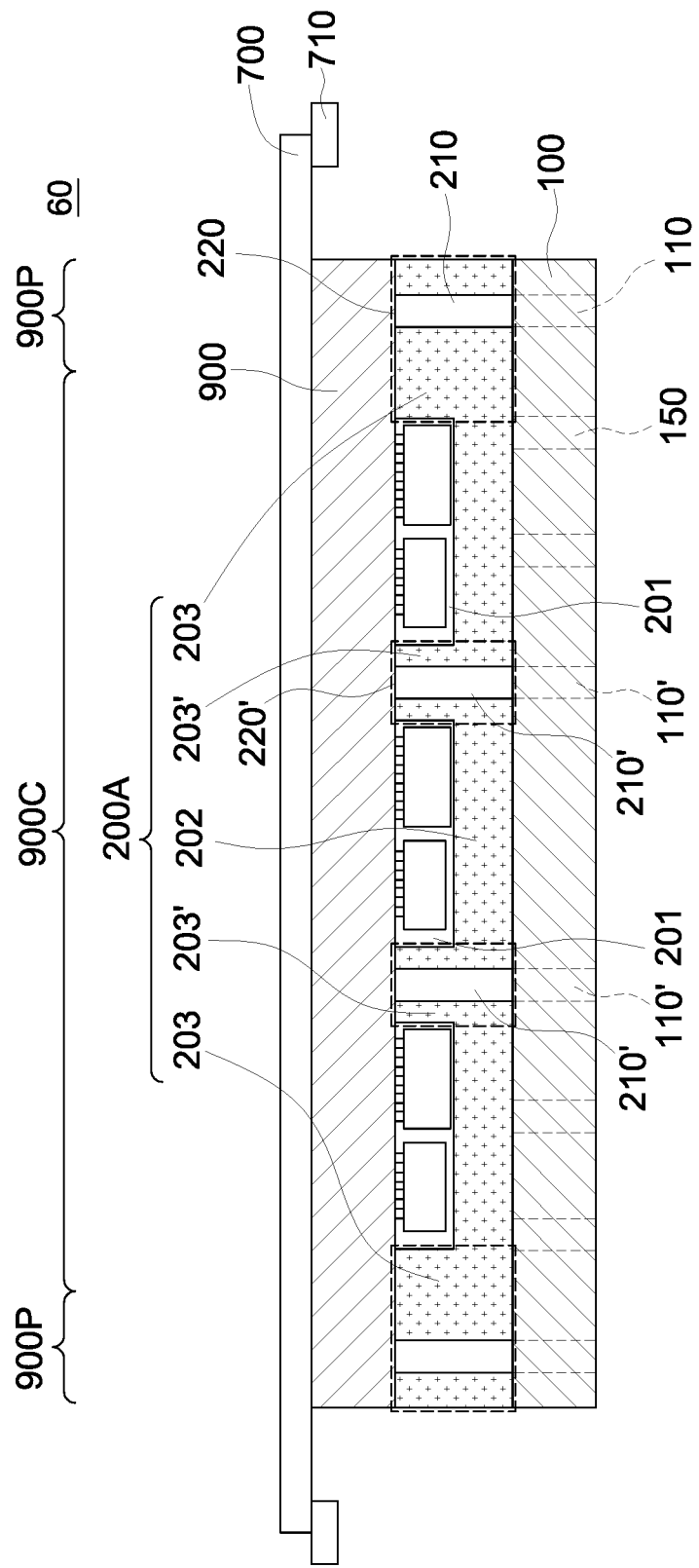
FIG. 6 illustrates a cross-sectional view of a wafer supporting mechanism in accordance with some embodiments of the present disclosure.

FIG. 6 illustrates a cross-sectional view of a wafer supporting mechanism 60 in accordance with some embodiments of the present disclosure. The wafer supporting mechanism 60 is similar to the wafer supporting mechanism 50 in FIG. 5 except that, for example, the wafer supporting mechanism 50 further includes a support wall 203' for the purpose of providing additional mechanical support and fixation to the center region 900C of the wafer 900.

In some embodiments, the support wall 203' is a portion of the cavity table 200A. In some embodiments, the support wall 203' is connected to the base plate 202. In some embodiments, a plurality of the accommodation spaces 201 are defined by the support walls 203 and 203' and the base plate 202. In some embodiments, the wafer supporting mechanism 50 may include a plurality of the support walls 203'.

In some embodiments, the wafer supporting mechanism 60 includes a gas channel 210' in the support wall 203' and an outlet 220' connected to the gas channel 210'. In some embodiments, the gas channel 210' is configured to align to a center region 900C of the wafer 900. In some embodiments, the outlet 220' is configured to contact the center region 900C of the wafer 900. In some embodiments, the base portion 100 may include one or more additional gas channels 110' at least partially connected to the gas channel 210' in the support wall 203'. Accordingly, the center region 900C of the wafer 900 can be supported by and fixated to the support wall 203' through vacuum suction through the gas channels 110' and 210'.

Figure 7:
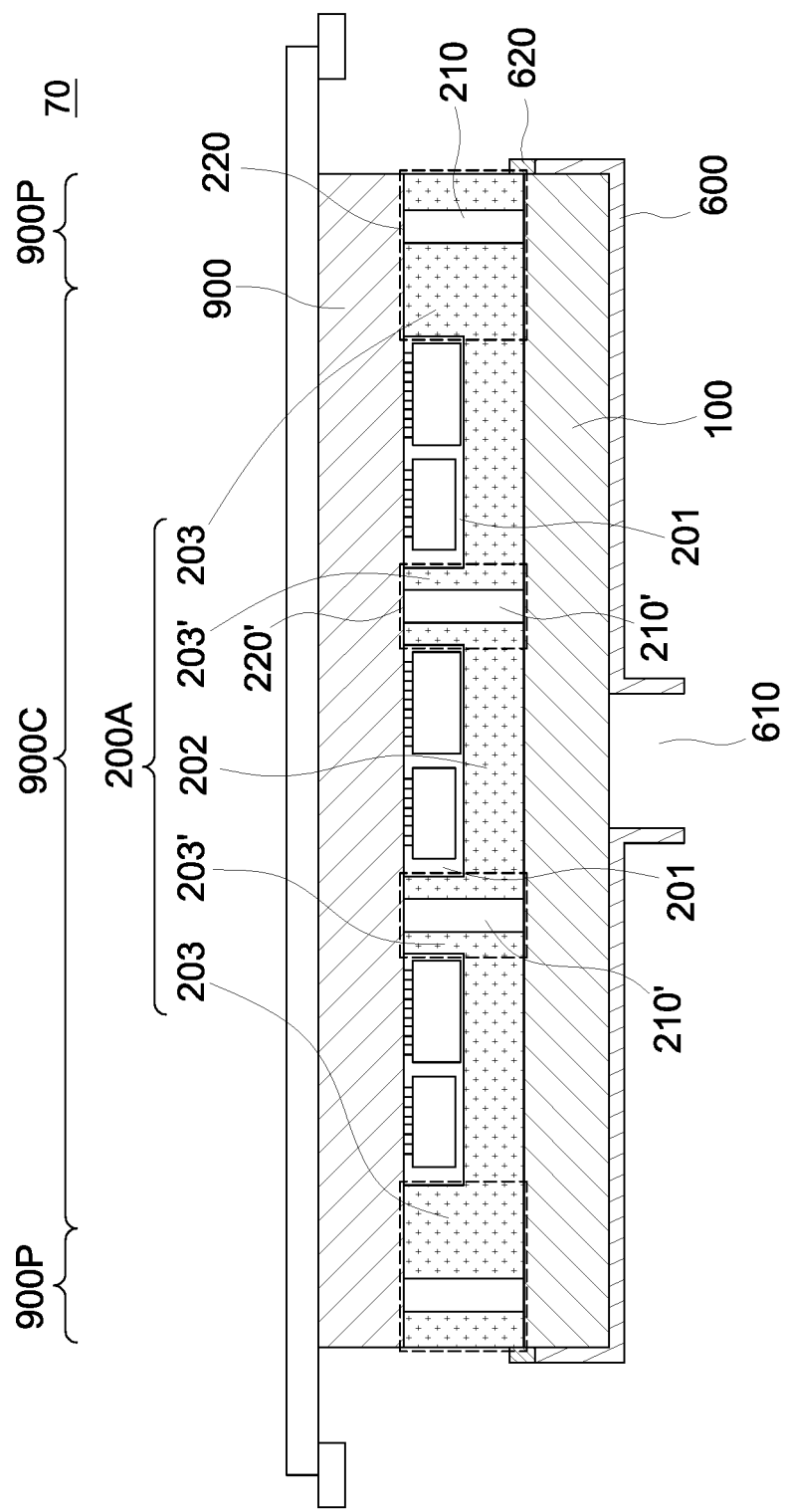
FIG. 7 illustrates a cross-sectional view of a wafer supporting mechanism in accordance with some embodiments of the present disclosure.

FIG. 7 illustrates a cross-sectional view of a wafer supporting mechanism 70 in accordance with some embodiments of the present disclosure. The wafer supporting mechanism 70 is similar to the wafer supporting mechanism 60 in FIG. 6 except that, for example, the base portion 100 of the wafer supporting mechanism 70 has a different design.

In some embodiments, the base portion 100 of the wafer supporting mechanism 70 is made of or includes a porous material. In some embodiments, the base portion 100 of the wafer supporting mechanism 70 is made of or includes a ceramic material. In some embodiments, the base portion 100 of the wafer supporting mechanism 70 is free of gas channels 110, 110' and 150.

In some embodiments, the wafer supporting mechanism 70 further includes a casing 600 enclosing the base portion 100. In some embodiments, the casing 600 includes an outlet 610 that is configured to connect to an exhaust mechanism (e.g., the exhaust mechanism 300, referring to FIG. 1C) for exhausting gas from the gas channel(s) formed of pores within the base portion 100. In some embodiments, the casing 600 may be made of or include aluminum. In some embodiments, the gas channels formed of pores within the base portion 100 are connected to the gas channels 210 and 210' of the support walls 203 and 203' of the cavity table 200A. In some embodiments, the casing 600 covers the base portion 100 and prevent gas communication between the porous material of the base portion 100 and atmosphere outside the base portion 100, except for the region exposed to the outlet 610 and the region contacting the cavity table 200A.

In some embodiments, the wafer supporting mechanism 70 further includes a fastening member 620 connecting the cavity table 200A and the base portion 100. In some embodiments, the fastening member 620 connects the cavity table 200A and the casing 600 which the base portion 100 is disposed.

Figure 8A:
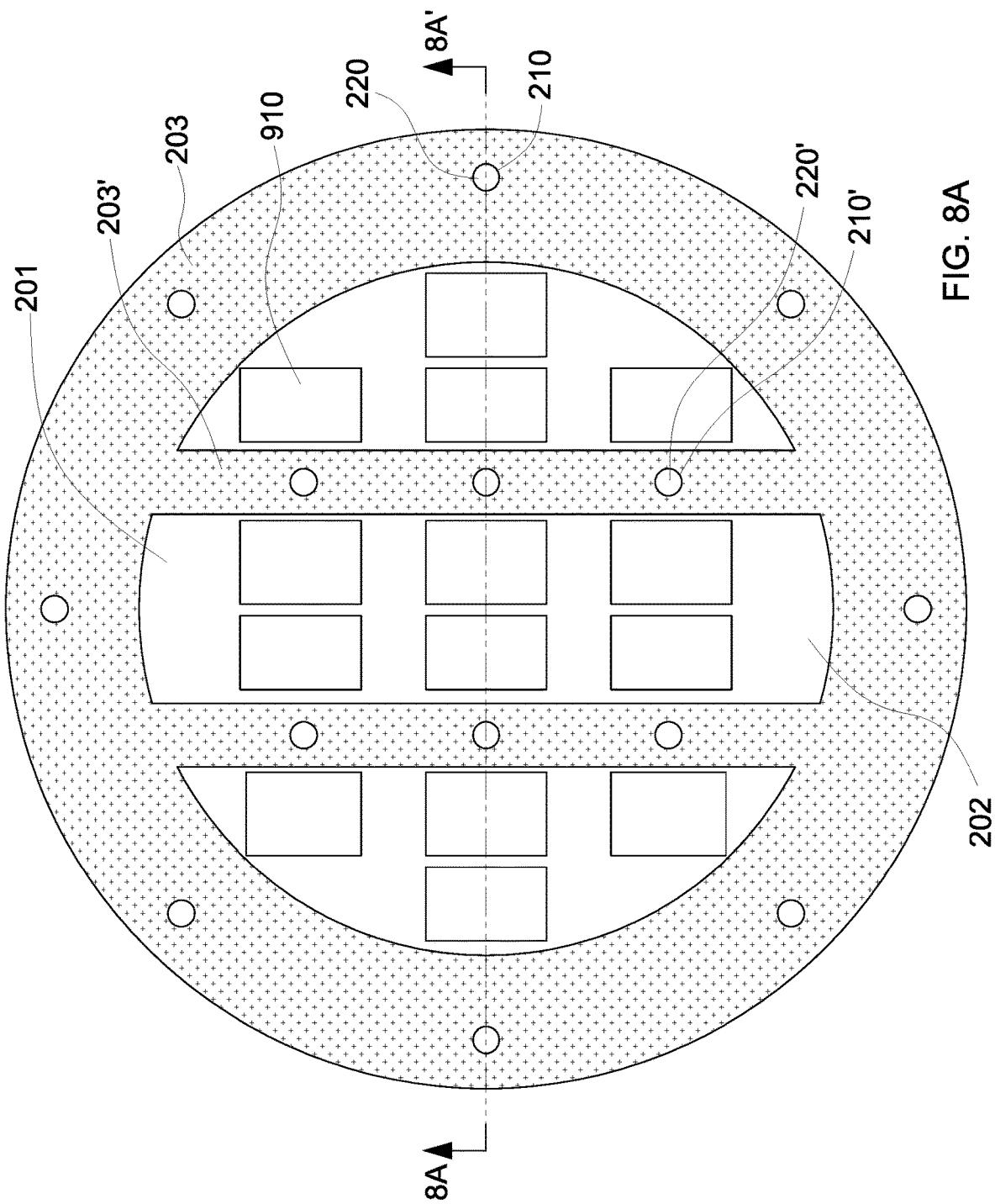
FIG. 8A illustrates a top view of a wafer supporting mechanism in accordance with some embodiments of the present disclosure.

FIG. 8A illustrates a top view of a wafer supporting mechanism in accordance with some embodiments of the present disclosure. In some embodiments, FIG. 6 illustrates a cross-sectional view along the cross-sectional line 8A-8A' in FIG. 8A. In some embodiments, FIG. 7 illustrates a cross-sectional view along the cross-sectional line 8A-8A' in FIG. 8A. It should be noted that semiconductor devices 910 are illustrated in FIG. 8A for clearer description.

In some embodiments, the support wall 203 includes a ring shape. In some embodiments, the support wall 203' includes a line shape. In some embodiments, the line-shaped support walls 203' are arranged in parallel and connected to the support wall 203 to define the accommodation spaces 201.

In some embodiments, the gas channels 210 are dispersedly arranged within the support wall 203. In some embodiments, the outlets 220 are dispersedly arranged over the support wall 203. In some embodiments, the gas channels 210' are dispersedly arranged within the support wall 203'. In some embodiments, the outlets 220' are dispersedly arranged over the support wall 203'. According to some embodiments of the present disclosure, with the aforesaid design of the support walls 203 and 203' and the outlets 220 and 220', the wafer 900 can be fixated to the cavity table 200A more strongly and stably.

Figure 8B:
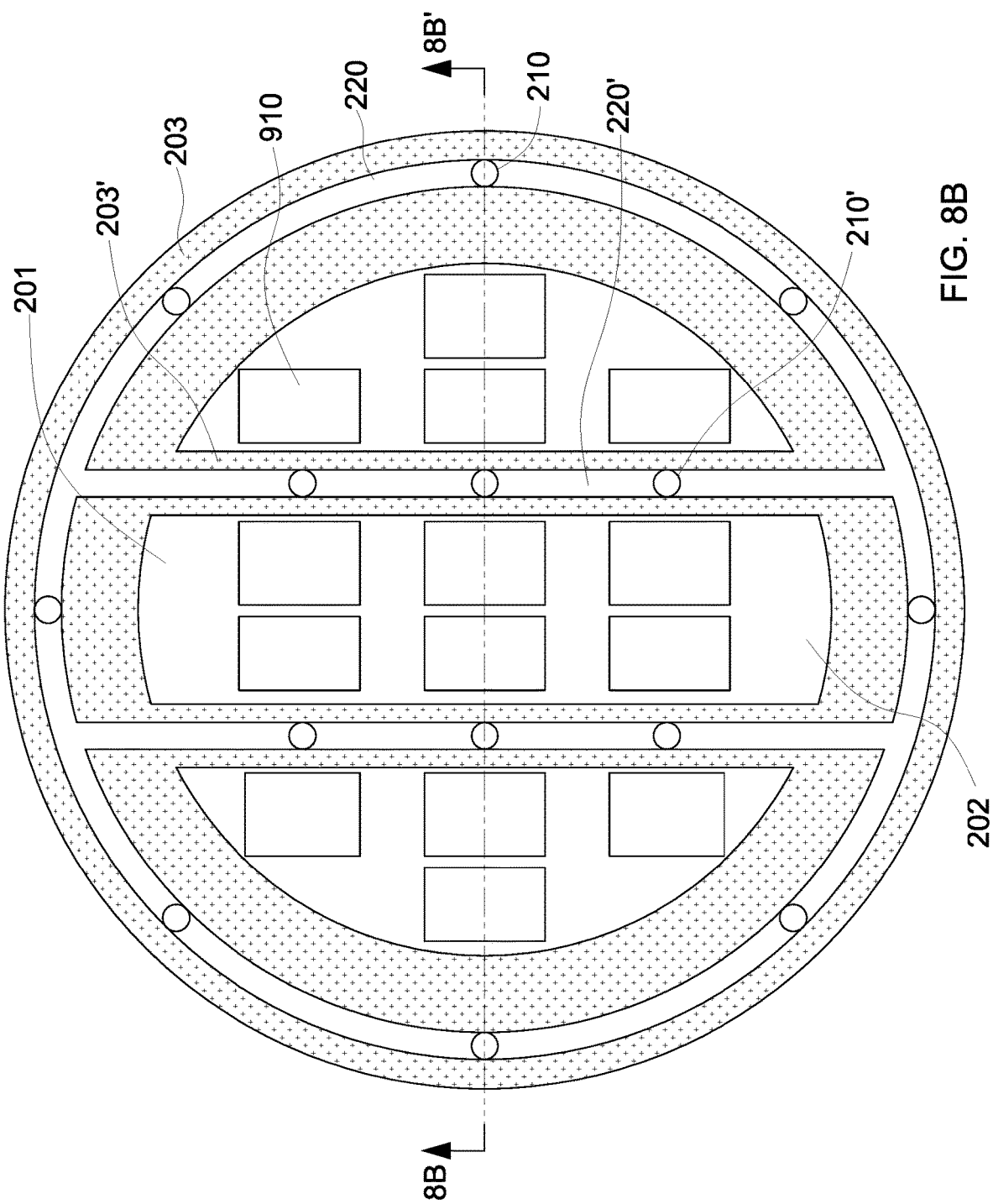
FIG. 8B illustrates a top view of a wafer supporting mechanism in accordance with some embodiments of the present disclosure.

FIG. 8B illustrates a top view of a wafer supporting mechanism in accordance with some embodiments of the present disclosure. In some embodiments, FIG. 6 illustrates a cross-sectional view along the cross-sectional line 8B-8B' in FIG. 8B. In some embodiments, FIG. 7 illustrates a cross-sectional view along the cross-sectional line 8B-8B' in FIG. 8B. It should be noted that semiconductor devices 910 are illustrated in FIG. 8A for clearer description.

In some embodiments, the gas channels 210 are dispersedly arranged within the support wall 203. In some embodiments, the outlet 220 includes a ring shape and is arranged over the support wall 203. In some embodiments, the gas channels 210 are connected to the outlet 220, and the outlet 220 is configured to contact a peripheral region of a wafer. In some embodiments, the gas channels 210' are dispersedly arranged within the support wall 203'. In some embodiments, the outlet 220' includes a line shape and is arranged over the support wall 203'. In some embodiments, the gas channels 210' are connected to the outlet 220', and the outlet 220' is configured to contact a center region of a wafer. According to some embodiments of the present disclosure, with the aforesaid design of the support walls 203 and 203' and the outlets 220 and 220', the wafer 900 can be fixated to the cavity table 200A more strongly and stably.

Figure 8C:
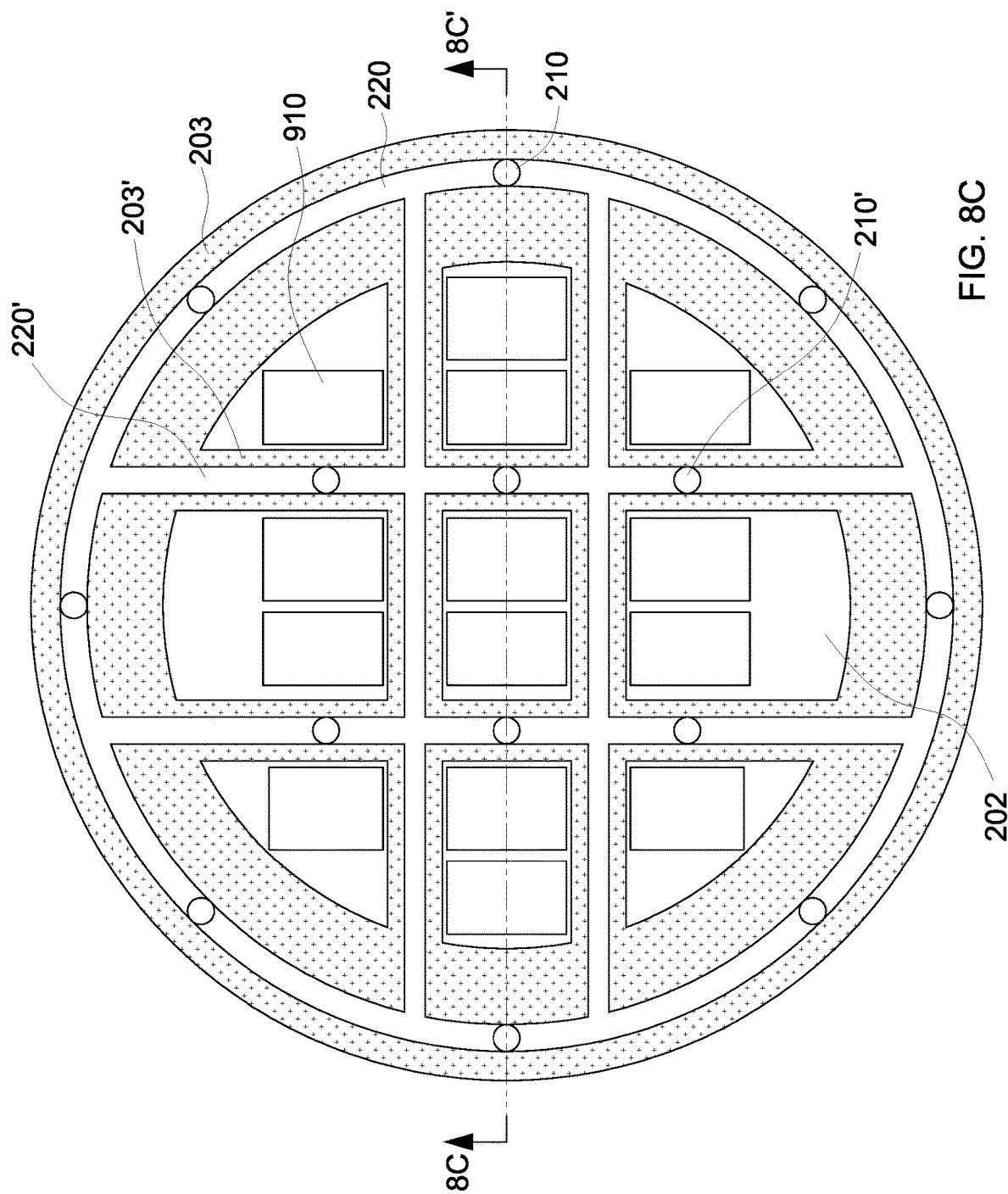
FIG. 8C illustrates a top view of a wafer supporting mechanism in accordance with some embodiments of the present disclosure.

FIG. 8C illustrates a top view of a wafer supporting mechanism in accordance with some embodiments of the present disclosure. In some embodiments, FIG. 6 illustrates a cross-sectional view along the cross-sectional line 8C-8C' in FIG. 8C. In some embodiments, FIG. 7 illustrates a cross-sectional view along the cross-sectional line 8C-8C' in FIG. 8C. It should be noted that semiconductor devices 910 are illustrated in FIG. 8A for clearer description.

In some embodiments, the line-shaped support walls 203' include two sets of paralleled arranged support walls 203' that are arranged in perpendicular to each other to form a grid-shaped pattern. In some embodiments, the line-shaped support walls 203' are connected to the support wall 203 to define the accommodation spaces 201.

In some embodiments, the gas channels 210 are dispersedly arranged within the support wall 203. In some embodiments, the outlet 220 includes a ring shape and is arranged over the support wall 203. In some embodiments, the gas channels 210 are connected to the outlet 220, and the outlet 220 is configured to contact a peripheral region of a wafer. In some embodiments, the gas channels 210' are dispersedly arranged within the support wall 203'. In some embodiments, the outlet 220' includes a grid shape and is arranged over the support wall 203'. In some embodiments, the gas channels 210' are connected to the outlet 220', and the outlet 220' is configured to contact a center region of a wafer. In some embodiments, one or more of the gas channels 210' are located at intersections of the support walls 203'. According to some embodiments of the present disclosure, with the aforesaid design of the support walls 203 and 203' and the outlets 220 and 220', the wafer 900 can be fixated to the cavity table 200A more strongly and stably.

FIG. 9A, FIG. 9B, FIG. 9C, FIG. 9D, and FIG. 9E illustrate various operations in a method of dicing a wafer 900 in accordance with some embodiments of the present disclosure.

Figure 9B:
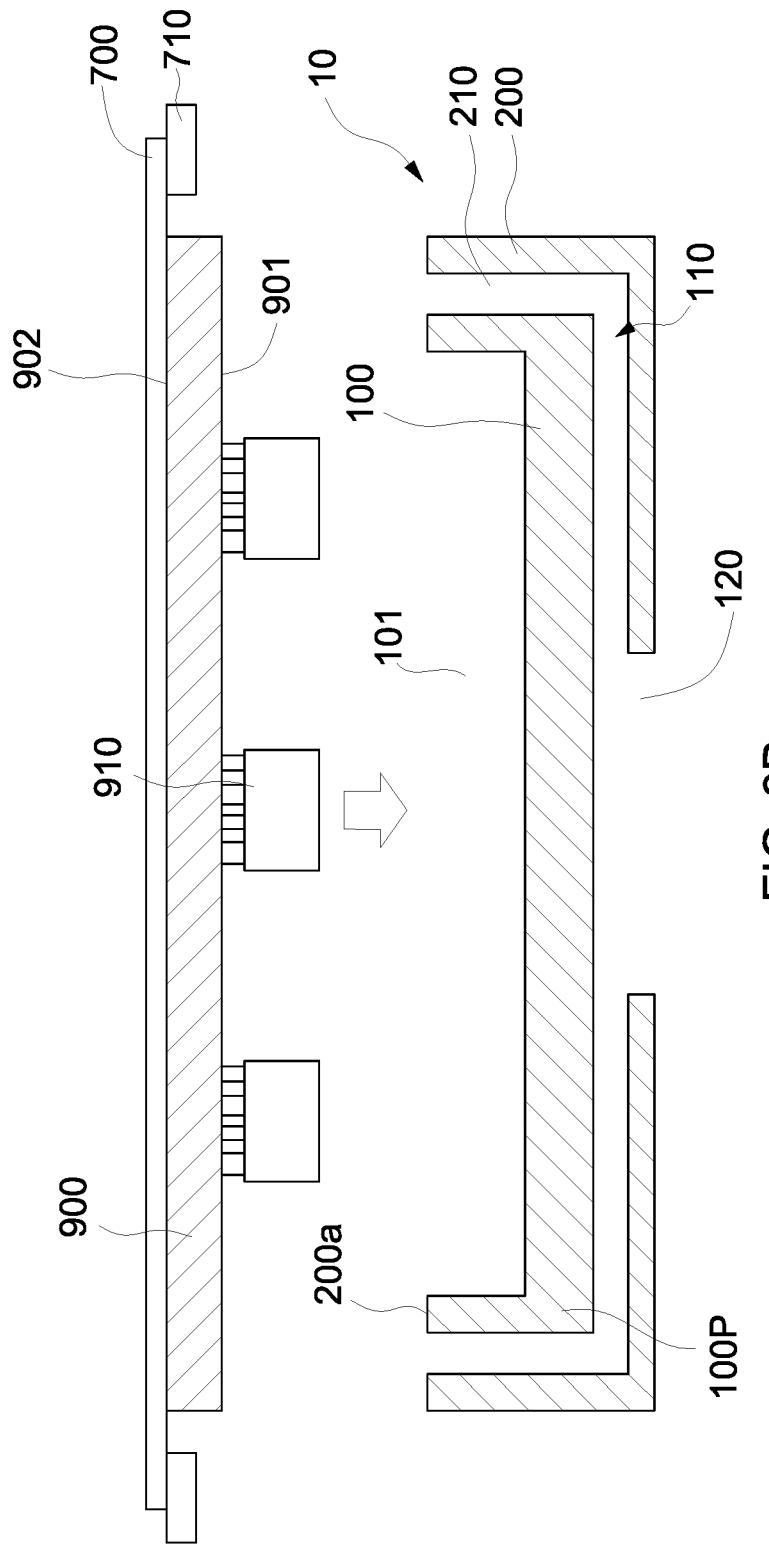

Referring to FIG. 9A, a wafer supporting mechanism 10 is provided. In some embodiments, the wafer supporting mechanism 10 includes at least a gas channel (e.g., the gas channel 110 and the gas channel 210) and an outlet 120 connected to the gas channel 110. In some embodiments, the gas channel 110 has at least an outlet 220. In some embodiments, the wafer supporting mechanism 10 includes a base portion 100 and a support portion 200, and an accommodation space 101 is defined by the base portion 100 and the support portion 200. In the present embodiments illustrated in FIGS. 9A-9E, the wafer supporting mechanism 10 has a structure substantially the same as that shown in FIG. 1A.

Referring to FIG. 9B, a wafer 900 is provided. In some embodiments, the wafer 900 includes a plurality of semiconductor devices 910 on a surface 901 of the wafer 900. In some embodiments, the wafer 900 is carried by a flexible tape 700 that is fixated on a frame 710. In some embodiments, the wafer 900 further has a surface 902 opposite to the surface 901, and the surface 901 of the wafer 900 is adhered to the flexible tape 700.

Figure 9C:
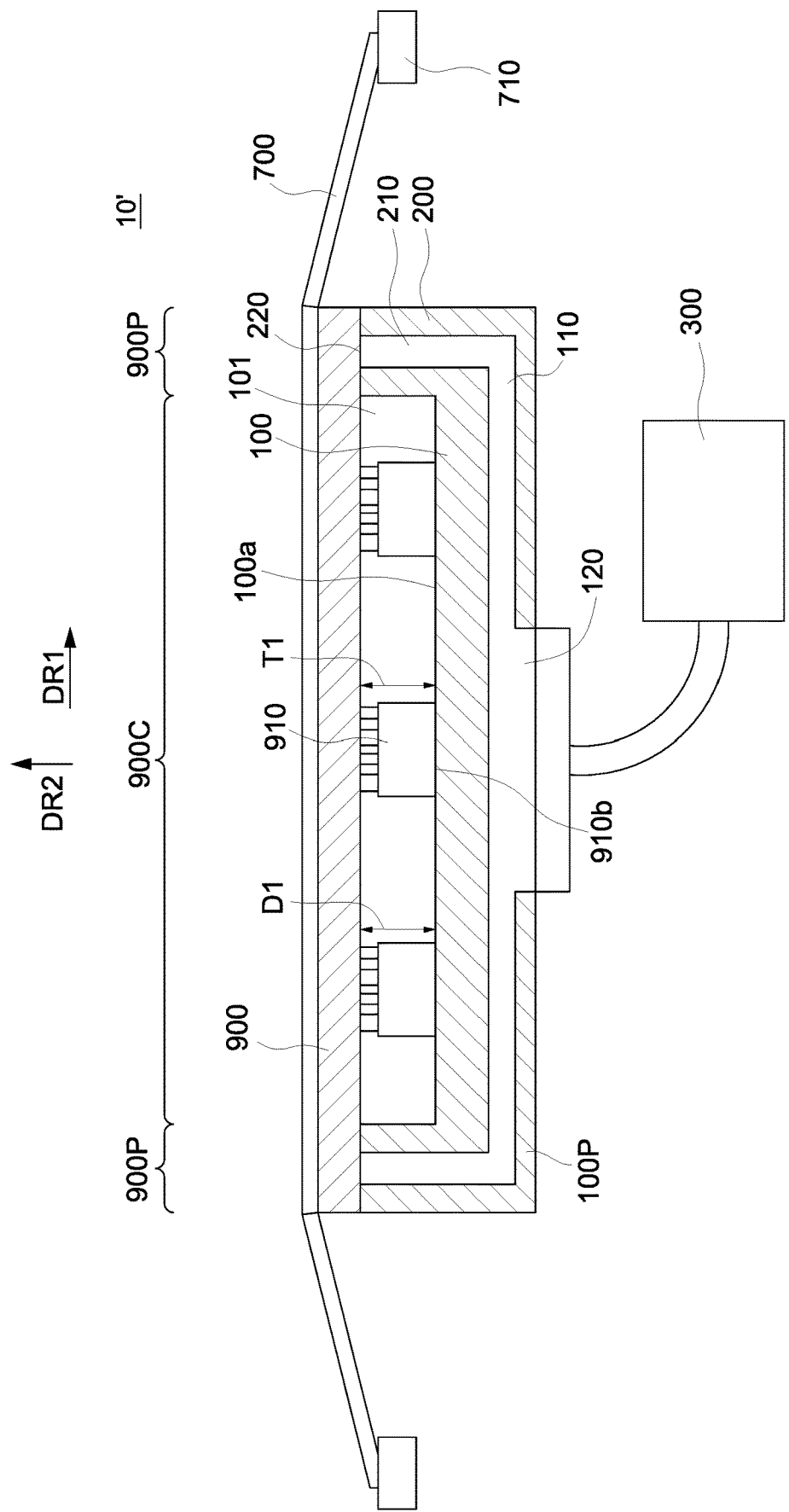

Referring to FIG. 9C, the wafer 900 is disposed on the wafer supporting mechanism 10 to cover the outlet 220 of the gas channel 210, and the wafer 900 is fixated to the wafer supporting mechanism 10 by exhausting gas from the gas channel 110 through the outlet 120. In some embodiments, the wafer 900 is fixated to the wafer supporting mechanism 10 through vacuum suction between the wafer 900 and the support portion 200.

In some embodiments, disposing the wafer 900 on the wafer supporting mechanism 10 to cover the outlet 220 includes the following operations: accommodating the semiconductor devices 910 in an accommodation space 101 of the wafer supporting mechanism 10, and covering the outlet 220 by contacting a peripheral region 900P of the wafer 900 to the outlet 220. In some embodiments, fixating the wafer 900 to the wafer supporting mechanism 10 includes providing vacuum suction to the wafer 900 through the outlet 120.

In some embodiments, an exhaust mechanism 300 is connected to the outlet 120 and exhaust gas from the gas channels 110 and the outlet 220 to provide vacuum suction to the wafer 900. In some embodiments, covering the outlet 220 by contacting the peripheral region 900P of the wafer 900 to the outlet 220 is prior to exhausting gas from the gas channel 110 through the outlet 120 by the exhaust mechanism 300.

Figure 9D:
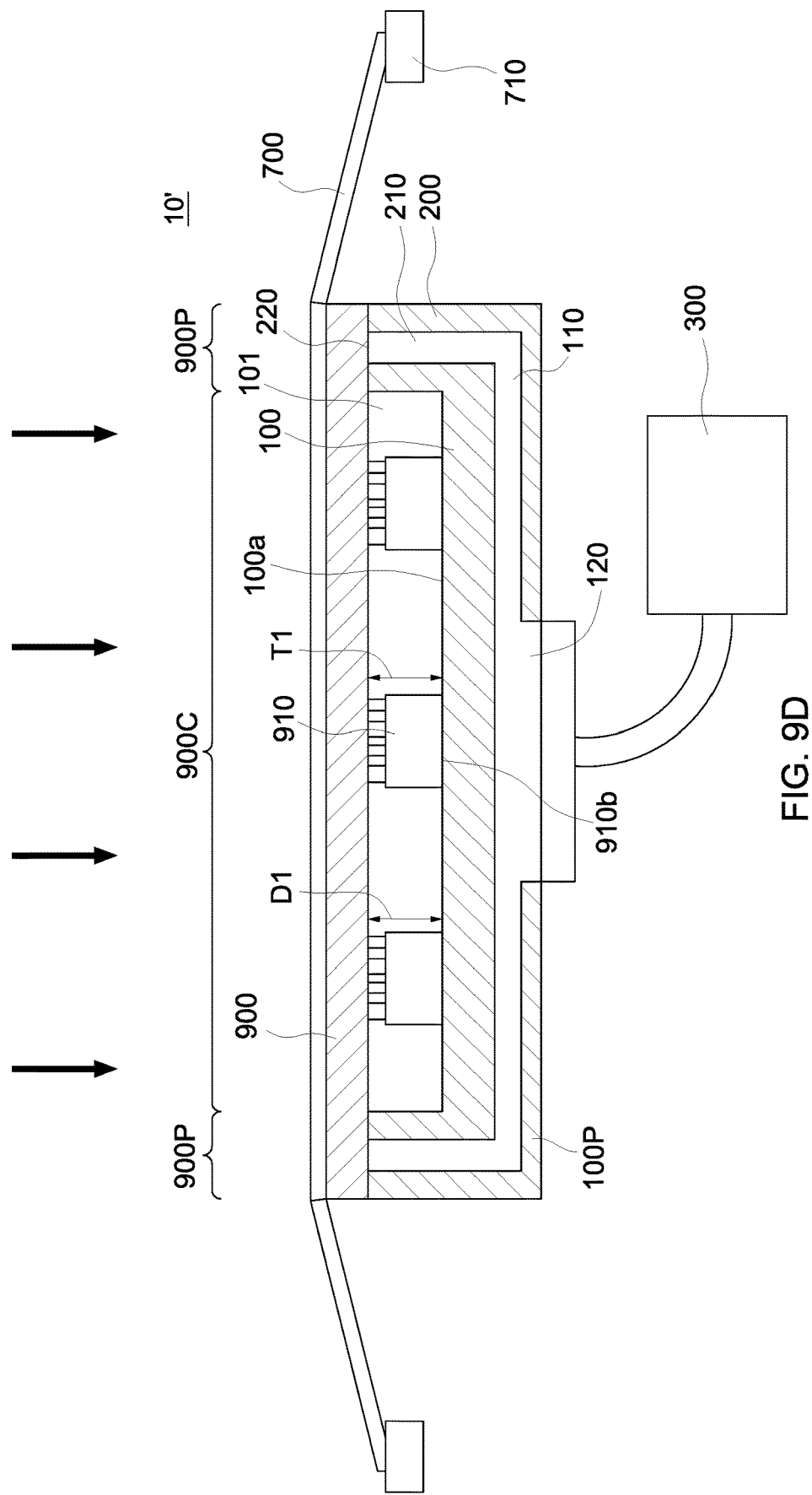

Referring to FIG. 9D, the wafer 900 is diced. In some embodiments, the wafer 900 is diced by a laser dicing process to separate the semiconductor devices 910. In some embodiments, the laser dicing process may be or include a stealth dicing process. In some embodiments, laser is applied on the wafer 900 along dicing lines. In some embodiments, exhausting gas from the gas channel 110 starts before starting dicing the wafer 900. In some embodiments, exhausting gas from the gas channel 110 is performed continuously when dicing the wafer 900. In some embodiments, exhausting gas from the gas channel 110 ends when dicing the wafer 900 is completed.

Figure 9E:
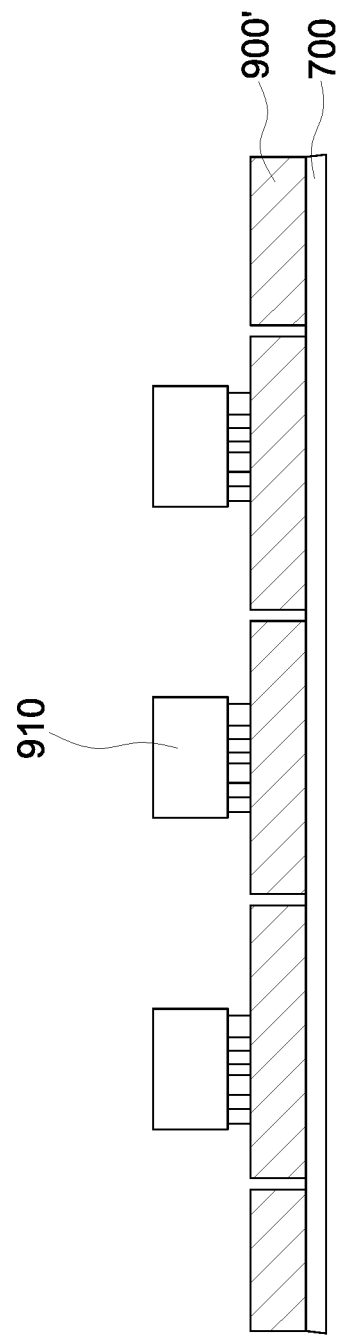

Referring to FIG. 9E, the flexible tape 700 is expanded to separate the diced wafers 900' and the semiconductor devices 910. In some embodiments, the flexible tape 700 is expanded after the wafer 900 having the semiconductor devices 910 is diced and removed from the wafer support mechanism 10.

According to some embodiments of the present disclosure, by using the wafer support mechanism 10 in a wafer dicing operation, the laser dicing process can be performed by applying a laser from a backside (e.g., the surface 902) of the wafer 900 leaving the front side (e.g., the surface 901) with the semiconductor devices 910 including metal layers or routing layers facing away from the laser. Therefore, the depth of penetration of the laser and the focus of the laser are not adversely affected by metal layers or routing layers on the propagating path of the laser.

Moreover, according to some embodiments of the present disclosure, by using the wafer support mechanism 10 in a wafer dicing operation, the laser dicing process is performed by applying a laser from the backside (e.g., the surface 902) of the wafer 900, since the semiconductor devices 910 are located on the front side (e.g., the surface 901) opposite to the back side where the laser is applied on, the size of the dicing lines (e.g., distances between adjacent semiconductor devices 910) can be minimized without damaging the semiconductor devices 910, and thus the number of die per wafer (DPW) can be significantly increased.

In addition, according to some embodiments of the present disclosure, by using the wafer support mechanism 10 in a wafer dicing operation, warpage of the wafer 900 can be reduced, which is advantageous to the control of the depth of penetration of the laser and the focus of the laser in the laser dicing process. Therefore, the wafer surface deviation caused by warpage can be reduced, and the yield of the wafer dicing process can be improved. For example, the percentage of the number of separated semiconductor devices 910 per wafer 900 to the number of semiconductor devices 910 per wafer 900 prior to dicing can be significantly increased to about 99.9%.

In some other embodiments, referring to FIGS. 9A-9E and FIG. 2, when the wafer supporting mechanism 20 is used, the support pins 400 support and contact the semiconductor devices 910 in the accommodation space 101 after the wafer 900 is disposed on the wafer supporting mechanism 20 to cover the outlet 220.

In some other embodiments, referring to FIGS. 9A-9E and FIG. 3, when the wafer supporting mechanism 30 is used, the deformable cushion 500 supports and contacts the semiconductor devices 910 in the accommodation space 101 after the wafer 900 is disposed on the wafer supporting mechanism 30 to cover the outlet 220.

In some other embodiments, referring to FIGS. 9A-9E and FIGS. 4A-4B, when the wafer supporting mechanism 40 is used, the method of dicing the wafer 900 further includes the following operation: purging gas into the accommodation space 101 after fixating the wafer 900 to the wafer supporting mechanism 40. The semiconductor devices 910 of the wafer 900 in the accommodation space 101 can be supported uniformly by the force provided from the purged gas.

In some other embodiments, referring to FIGS. 9A-9E and FIG. 5, when the wafer supporting mechanism 50 is used, vacuum suction between the wafer 900 and the wafer supporting mechanism 50 is provided by exhausting gas from the gas channel 110, the gas channel 210 and the outlet 220 by the exhaust mechanism 300. In some embodiments, vacuum suction between the cavity table 200A and the base portion 100 of the wafer supporting mechanism 50 is provided by exhausting gas from the gas channel 150 by the exhaust mechanism 300.

In some other embodiments, referring to FIGS. 9A-9E and FIG. 6, when the wafer supporting mechanism 60 is used, vacuum suction between the wafer 900 and the wafer supporting mechanism 60 is provided by exhausting gas from the gas channels 110 and 110', the gas channels 210 and 210', and the outlets 220 and 220' by the exhaust mechanism 300. In some embodiments, vacuum suction between the cavity table 200A and the base portion 100 of the wafer supporting mechanism 60 is provided by exhausting gas from the gas channel 150 by the exhaust mechanism 300.

In some other embodiments, referring to FIGS. 9A-9E and FIG. 7, when the wafer supporting mechanism 70 is used, vacuum suction between the wafer 900 and the wafer supporting mechanism 70 is provided by exhausting gas from the outlet 610, the gas channels formed of pores within the porous base portion 100, the gas channels 210 and 210', and the outlets 220 and 220' by the exhaust mechanism 300. In some embodiments, vacuum suction between the cavity table 200A and the base portion 100 of the wafer supporting mechanism 70 is provided by exhausting gas from the outlet 610 and the gas channels formed of pores within the porous base portion 100 by the exhaust mechanism 300.

As illustrated in FIGS. 9A-9E and FIGS. 5-7, the cavity tables 200A with different designs can be implemented according to different chip on wafer (COW) structures. The base portion 100 can be a conventional chuck table without significant change. For example, a first batch of wafer dicing can implement a cavity table 200A of a first design, and a second batch of wafer dicing can implement a cavity table 200A of a second design upon the same base portion 100.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A wafer supporting mechanism, comprising:
   a carrier configured to support a wafer carrying at least one semiconductor device on a first surface of the wafer; and
   a cushion element configured to cover a portion of the wafer, wherein the carrier comprises a base portion and a support portion protruded beyond a peripheral region of the base portion, and the base portion and the support portion collectively define an accommodation space for accommodating the cushion element and the at least one semiconductor device, and wherein the cushion element is received within the accommodation space and configured to support the wafer to prevent warpage of the wafer during a wafer dicing process.

2. The wafer supporting mechanism as claimed in claim 1, wherein a top surface of the cushion element is not higher than a top surface of the support portion with respect to a bottom surface opposite to the top surface of the cushion element.

3. The wafer supporting mechanism as claimed in claim 2, wherein in a cross-sectional view, the accommodation space is defined by a first inner sidewall and a second inner sidewall facing the first inner sidewall of the support portion, the cushion element comprises a first portion contacting the first inner sidewall and a second portion separated from the first portion and contacting the second inner sidewall, and a first width of the first portion is different from a second width of the second portion.

4. The wafer supporting mechanism as claimed in claim 1, wherein the carrier comprises a gas channel horizontally overlapping the cushion element.

5. The wafer supporting mechanism as claimed in claim 1, wherein the cushion element is configured to support and surround the at least one semiconductor device to prevent the wafer from the warpage during the wafer dicing process.

6. A wafer supporting mechanism, comprising:
a base portion;
a support portion connected to the base portion, wherein an accommodation space is defined by the base portion and the support portion, the accommodation space is configured to accommodate a semiconductor device attached to a wafer, and the semiconductor device is accommodated between a top surface of the support portion and a top surface of the base portion; and
a gas channel within the support portion and having an outlet, wherein the outlet is exposed by the top surface of the support portion and configured to fix a peripheral region of the wafer,
wherein the wafer supporting mechanism is configured to support a bottom surface of the wafer and a bottom surface of the semiconductor device, and wherein the bottom surface of the wafer and the bottom surface of the semiconductor device are at different elevations, and wherein a plurality of the semiconductor devices are attached to and protruded beyond the bottom surface of the wafer, and the base portion contacts at least one of bottom surfaces of the plurality of the semiconductor devices.

7. The wafer supporting mechanism as claimed in claim 6, wherein an elevation of the outlet is higher than an elevation of the top surface of the base portion with respect to a bottom surface opposite to the top surface of the base portion, and the outlet is configured to substantially aligns with the bottom surface of the wafer when the wafer is disposed on the wafer supporting mechanism.

8. The wafer supporting mechanism as claimed in claim 7, wherein the accommodation space is recessed from the top surface of the support portion toward the top surface of the base portion and configured to accommodate the semiconductor device which is protruded beyond the bottom surface of the wafer.

9. The wafer supporting mechanism as claimed in claim 8, wherein the gas channel is isolated from the accommodated space by the support portion.

10. A wafer supporting mechanism, comprising:
a cavity table, comprising:
a first support wall; and
a gas channel in the first support wall and configured to match a peripheral region of a wafer, wherein the cavity table comprises at least one accommodation space recessed from a top surface of the cavity table for accommodating a plurality of semiconductor devices on a surface of the wafer facing the at least one accommodation space,
wherein, in a cross-sectional view, the cavity table further comprises a base plate and a plurality of supporters, and the supporters are within the at least one accommodation space and configured to contact the wafer without contacting the semiconductor devices when the wafer and the semiconductor devices are supported by the wafer supporting mechanism; and
a base portion comprising a channel and an outlet connected to the channel, and the supporters are fixated to the base portion through vacuum suction provided by the channel.

11. The wafer supporting mechanism as claimed in claim 10, wherein the outlet is not vertically overlapped with the semiconductor devices when the wafer and the semiconductor devices are supported by the wafer supporting mechanism.

12. The wafer supporting mechanism as claimed in claim 10, wherein the supporters comprise a supporting surface configured to movably contact the semiconductor devices.

13. The wafer supporting mechanism as claimed in claim 10, wherein in the cross-sectional view, the wafer supporting mechanism further comprises a second support wall, and the supporters are disposed between the first support wall and the second support wall.

14. The wafer supporting mechanism as claimed in claim 10, wherein a height of at least one of the supporters is greater than a thickness of at least one of the semiconductor devices.

15. The wafer supporting mechanism as claimed in claim 14, wherein the at least one of the supporters is configured to contact a first portion of the surface of the wafer, the first support wall is configured to contact a second portion of the surface of the wafer, and the first portion is closer to a center region of the wafer than the second portion is.

16. The wafer supporting mechanism as claimed in claim 15, further comprising a base portion having a top surface connected to the supporters.

17. The wafer supporting mechanism as claimed in claim 10, wherein at least two of the supporters define the at least one accommodation space for accommodating the semiconductor devices, the supporters comprise a first supporter closest to the semiconductor devices, and a distance between the first support wall and the first supporter is less than a distance between the first support wall and the semiconductor devices when the wafer and the semiconductor devices are supported by the wafer supporting mechanism.

* * * * *